United States Patent
Muta et al.

(10) Patent No.: US 12,261,064 B2
(45) Date of Patent: Mar. 25, 2025

(54) TANK, SUBSTRATE PROCESSING APPARATUS, AND METHOD OF USING THE TANK

(71) Applicant: TOKYO ELECTRON LIMITED, Tokyo (JP)

(72) Inventors: Tomohiko Muta, Koshi (JP); Daiki Shibata, Koshi (JP); Akiko Kai, Koshi (JP); Makoto Ogata, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1357 days.

(21) Appl. No.: 16/870,085

(22) Filed: May 8, 2020

(65) Prior Publication Data

US 2020/0357662 A1    Nov. 12, 2020

(30) Foreign Application Priority Data

May 10, 2019   (JP) .................. 2019-089850

(51) Int. Cl.
*H01L 21/67*  (2006.01)
*B05C 11/10*  (2006.01)

(52) U.S. Cl.
CPC .......... *H01L 21/6715* (2013.01); *B05C 11/10* (2013.01); *H01L 21/67178* (2013.01)

(58) Field of Classification Search
CPC .......... H01L 21/67017; H01L 21/6715; Y10T 137/2984; Y10T 137/86324; B67C 2003/2671–268; B65B 3/22; B05C 11/10
See application file for complete search history.

(56) References Cited

U.S. PATENT DOCUMENTS

| | | | |
|---|---|---|---|
| 9,165,797 B2* | 10/2015 | Yoshihara | H01L 21/67 |
| 10,065,844 B2* | 9/2018 | Buchik | B67D 1/0082 |
| 10,632,491 B2* | 4/2020 | Ueda | C08G 59/4215 |
| 2013/0205611 A1* | 8/2013 | Wamura | C23C 16/45563 |
| | | | 137/154 |
| 2018/0010252 A1* | 1/2018 | Murata | C23C 18/1675 |
| 2018/0250695 A1* | 9/2018 | Choi | C23C 16/4481 |

FOREIGN PATENT DOCUMENTS

| | | |
|---|---|---|
| CN | 107449721 A | 12/2017 |
| JP | H01-220827 A | 9/1989 |
| JP | 2005-058842 A | 3/2005 |
| JP | 2015-066480 A | 4/2015 |

* cited by examiner

*Primary Examiner* — Kevin F Murphy
(74) *Attorney, Agent, or Firm* — Nath, Goldberg & Meyer; Jerald L. Meyer; Tanya E. Harkins

(57) ABSTRACT

A tank includes a container part having an upper wall, a sidewall and a bottom wall to store a processing liquid therein, a liquid discharge passage installed at a position higher than a liquid surface of the processing liquid stored in the container part to discharge the processing liquid into the container part, and a gas discharge passage installed at a position higher than the liquid surface to discharge a gas into the container part. The liquid discharge passage discharges the processing liquid from the liquid discharge port so that the processing liquid is brought into contact with a portion above the liquid surface of an inner surface of the sidewall. The gas discharge passage discharges the gas from the gas discharge port so that the gas is brought into contact with a portion above the liquid surface of an inner surface of the container part.

11 Claims, 15 Drawing Sheets

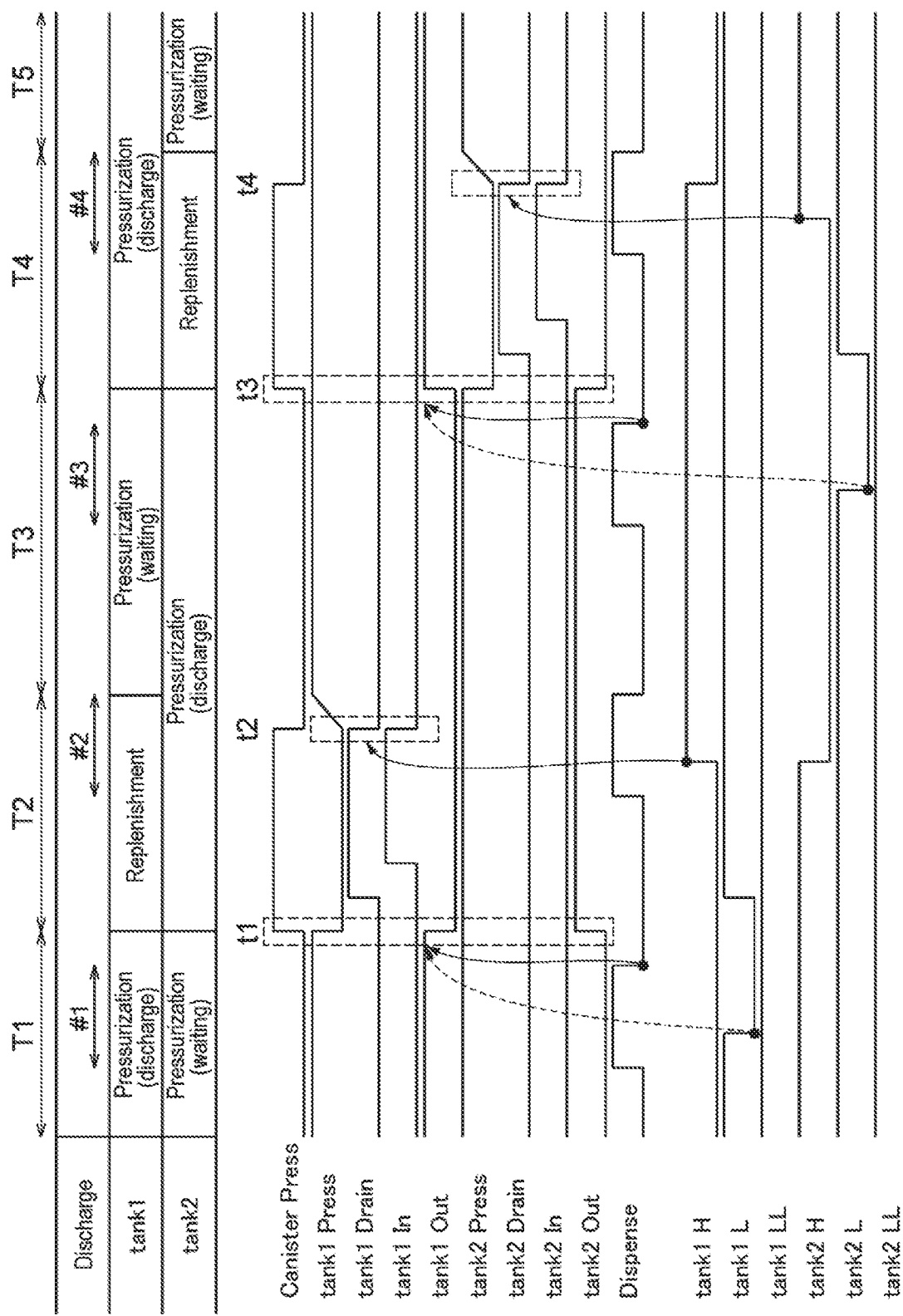

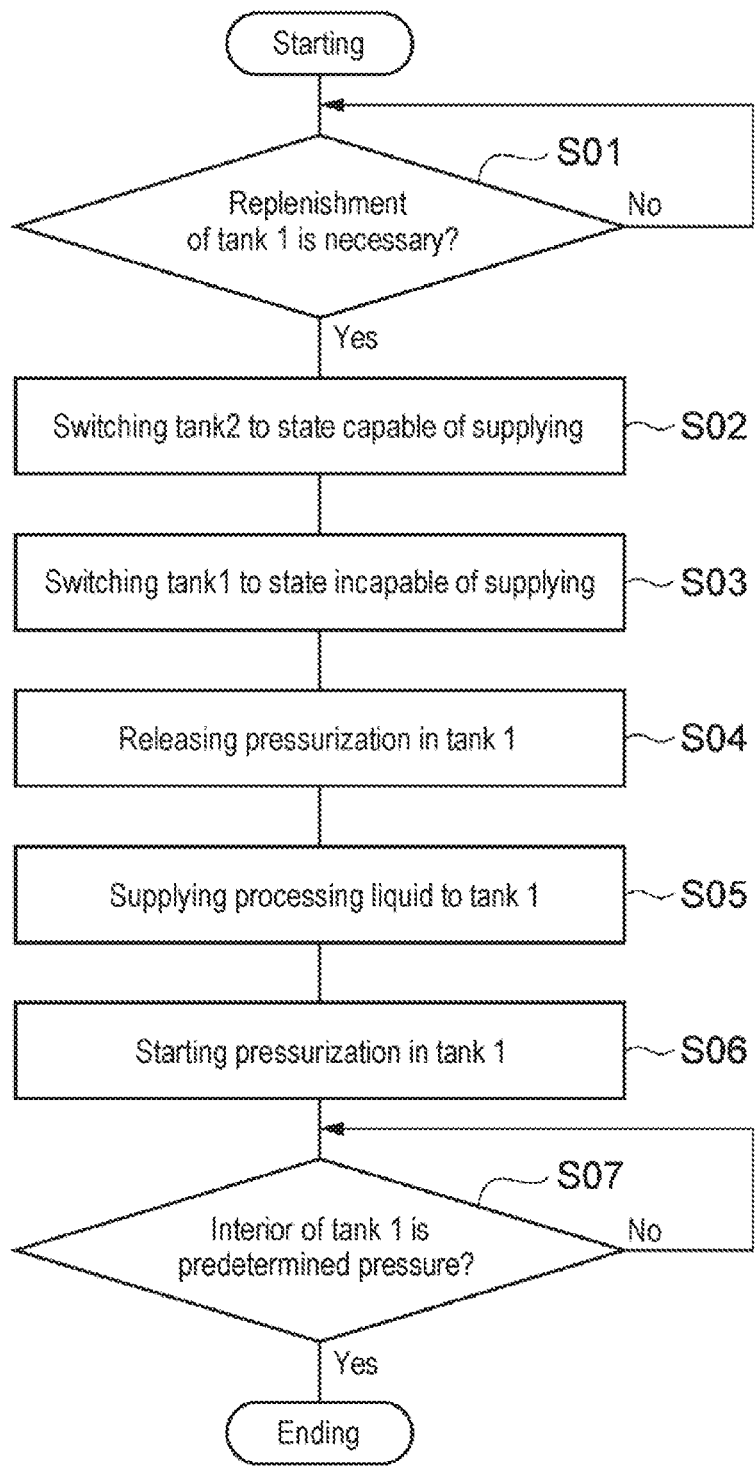

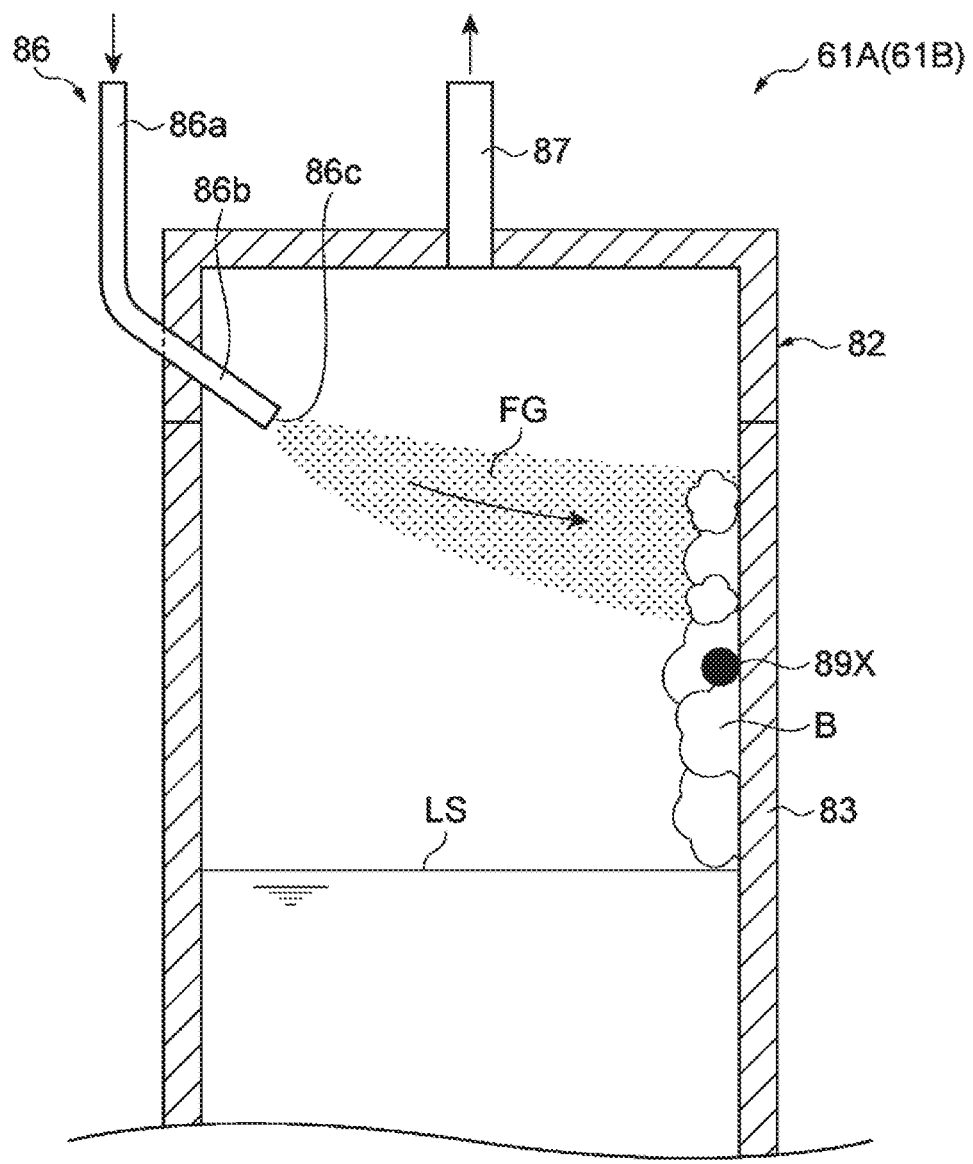

TANK, SUBSTRATE PROCESSING APPARATUS, AND METHOD OF USING THE TANK

CROSS-REFERENCE TO RELATED APPLICATION

This application is based upon and claims the benefit of priority from Japanese Patent Application No. 2019-089850, filed on May 10, 2019, the entire contents of which are incorporated herein by reference.

TECHNICAL FIELD

The present disclosure relates to a tank, a substrate processing apparatus, and a method of using the tank.

BACKGROUND

Patent Document 1 discloses a resist processing apparatus which rotates and processes a substrate to be processed. The resist processing apparatus includes means for supplying a resist or a developing solution used for processing a target surface of the substrate to be processed, and means for detecting a remaining amount of a storage container (tank) of the resist or the developing solution used for processing.

PRIOR ART DOCUMENTS

Patent Documents

Patent Document 1: Japanese laid-open publication No. H1-220827

SUMMARY

According to one embodiment of the present disclosure, there is provided a tank, including: a container part having an upper wall, a sidewall and a bottom wall, and configured to store a processing liquid therein; a liquid discharge passage having a liquid discharge port installed at a position higher than a liquid surface of the processing liquid stored in the container part, and configured to discharge the processing liquid into the container part; and a gas discharge passage having a gas discharge port installed at a position higher than the liquid surface, and configured to discharge a gas into the container part, wherein the liquid discharge passage is configured to discharge the processing liquid from the liquid discharge port so that the processing liquid is brought into contact with a portion above the liquid surface of an inner surface of the sidewall, and wherein the gas discharge passage is configured to discharge the gas from the gas discharge port so that the gas is brought into contact with a portion above the liquid surface of an inner surface of the container part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a timing chart illustrating an example of various operations in the liquid supply.

FIG. 8 is a flowchart illustrating an example of a replenishment procedure for the tank.

FIG. 9 is a schematic diagram illustrating an example of a method of using the tank.

DETAILED DESCRIPTION

Figure 1:
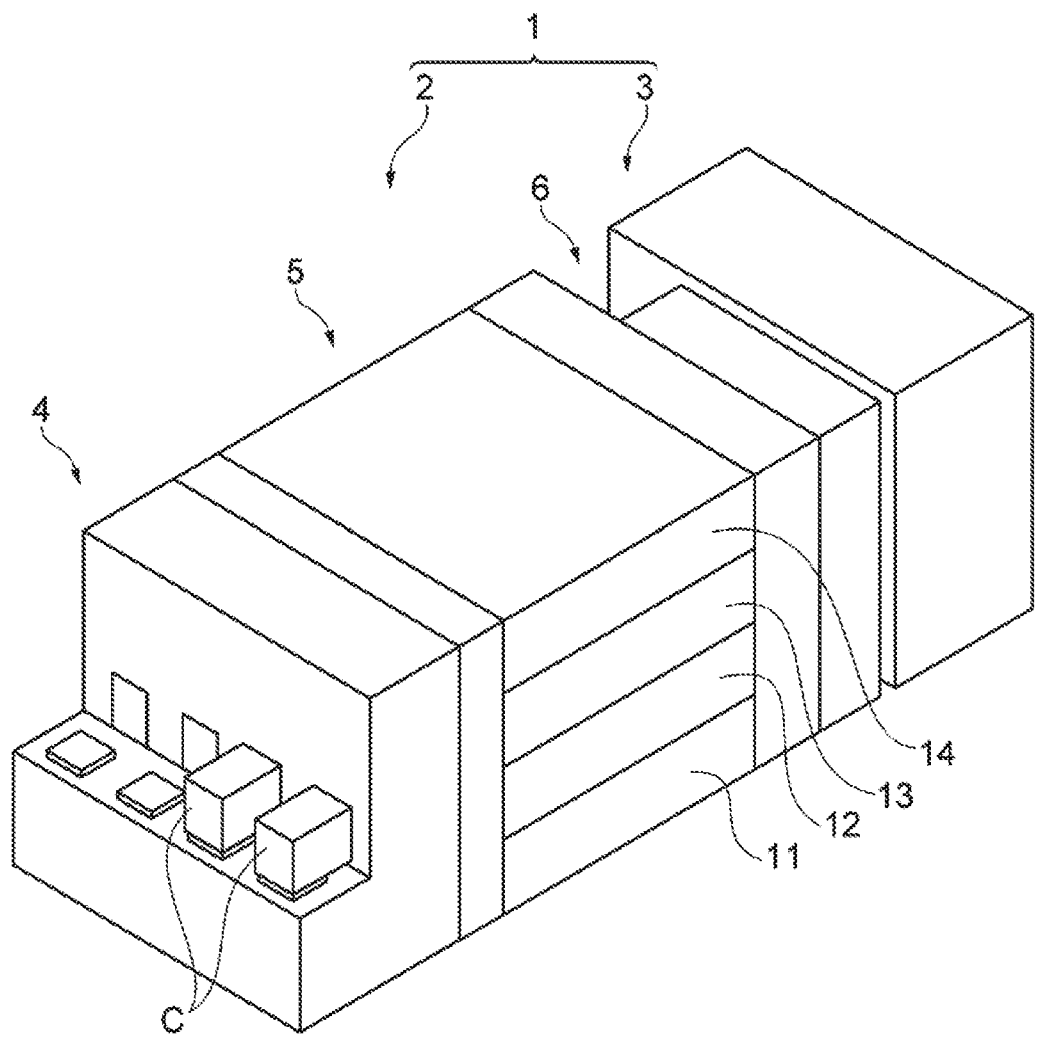
FIG. 1 is a schematic view illustrating a schematic configuration of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Various exemplary embodiments will now be described.

A tank according to an embodiment of the present disclosure includes a container part having an upper wall, a sidewall and a bottom wall and configured to store a processing liquid therein, a gas discharge passage having a liquid discharge port installed at a position higher than a liquid surface of the processing liquid stored in the container part and configured to discharge the processing liquid into the container part, and a gas discharge passage having a gas discharge port installed at a position higher than the liquid surface and configured to discharge a gas into the container part. The liquid discharge passage is configured to discharge the processing liquid from the liquid discharge port so that the processing liquid is brought into contact with a portion above the liquid surface of an inner surface of the sidewall. The gas discharge passage is configured to discharge the gas from the gas discharge port so that the gas is brought into contact with a portion above the liquid surface of an inner surface of the container part.

In this tank, the processing liquid discharged from the liquid discharge port is brought into contact with a portion above the liquid surface of the inner surface of the sidewall of the container part. Furthermore, the gas discharged from the gas discharge port is brought into contact with a portion above the liquid surface in the container part. Therefore, the discharged processing liquid and gas are supplied into the container part without direct contact with the liquid surface of the processing liquid already stored in the container part. As a result, since foaming of the processing liquid caused by direct contact of the processing liquid and the gas with the liquid surface is suppressed, it is possible to prevent the processing liquid containing bubbles from being supplied to a substrate.

An extension direction of an end of the liquid discharge passage including the liquid discharge port may be inclined to the vertical direction. In this case, the component of the flow velocity of the processing liquid along the vertical direction is reduced, compared with a case where the processing liquid is discharged downward along the vertical direction. Therefore, since the force acting downward in the vertical direction can be reduced when the processing liquid supplied from the liquid discharge passage is brought into contact with the processing liquid already stored in the container, the foaming of the processing liquid caused by the discharge of the processing liquid is more reliably suppressed.

In a plane intersecting the vertical direction, the cross section of the inner surface of the sidewall may be circular. Both a virtual line extending in the extension direction of the end of the liquid discharge passage including the liquid discharge port and a virtual line extending in the extension direction of the end of the gas discharge passage including the gas discharge port may not be orthogonal to the inner surface of the sidewall, as viewed in a plan view. In this case, the processing liquid discharged from the liquid discharge port and the gas discharged from the gas discharge port flow along the inner surface of the sidewall. Therefore, the discharged processing liquid and gas are more reliably prevented from directly making contact with the liquid surface of the processing liquid stored in the container part. As a result, the foaming of the processing liquid caused by direct contact of the processing liquid and the gas with the liquid surface is more reliably suppressed.

The liquid discharge port and the gas discharge port may be opposite to each other with the center in the container part interposed therebetween, as viewed in a plan view. In this case, the processing liquid discharged from the liquid discharge port is supplied into the container part without contact with the gas discharge passage including the gas discharge port. As a result, it is possible to prevent foaming of the processing liquid caused by contact of the processing liquid discharged from the liquid discharge port with another member until it reaches the processing liquid in the container part.

The tank may further include a plurality of liquid surface detection parts, each configured to detect that the height of the liquid surface reaches a predetermined position. The predetermined position detected by each of the plurality of liquid surface detection parts may be lower than the liquid discharge port, the gas discharge port, a position at which the processing liquid discharged from the liquid discharge port is brought into contact with the sidewall, and a position at which the gas discharged from the gas discharge port is brought into contact with the container part. In this case, for example, by setting the processing liquid to be stored to the highest predetermined position, it is possible to more reliably prevent the gas and the processing liquid discharged into the container part from directly making contact with the liquid surface.

At least a portion of the inner surface of the sidewall located below the liquid discharge port may be inclined to the vertical direction so that the processing liquid flows along the inner surface of the sidewall. In this case, when the processing liquid flowing along the inner surface of the sidewall reaches the liquid surface, the vertical downward component of the flow velocity of the processing liquid is reduced. As a result, it is possible to suppress foaming of the processing liquid caused by contact of the processing liquid flowing along the sidewall with the liquid surface.

The liquid discharge passage may have a discharge part including the liquid discharge port and a delivery part for delivering the processing liquid to the discharge part. A flow passage cross-sectional area of the discharge part may be larger than a flow passage cross-sectional area of the delivery part. With this configuration, it is possible to prevent disturbance in the behavior of the liquid from being caused by release of the pressure applied to the processing liquid immediately after the processing liquid is discharged into the tank.

A substrate processing apparatus according to another embodiment of the present disclosure includes a liquid supply having a tank for temporarily storing a processing liquid used for substrate processing, and a nozzle for discharging the processing liquid supplied from the liquid supply toward a substrate to be processed. The tank includes a container part having an upper wall, a sidewall and a bottom wall and configured to store the processing liquid therein, a liquid discharge passage having a liquid discharge port installed at a position higher than a liquid surface of the processing liquid stored in the container part and configured to discharge the processing liquid into the container part, and a gas discharge passage having a gas discharge port installed at a position higher than the liquid surface and configured to discharge a gas into the container part. The liquid discharge passage is configured to discharge the processing liquid from the liquid discharge port so that the processing liquid is brought into contact with a portion above the liquid surface of the inner surface of the sidewall. The gas discharge passage is configured to discharge the gas from the gas discharge port so that the gas is brought into contact with a portion above the liquid surface of the inner surface of the container part. In this case, similar to the above, foaming of the processing liquid caused by direct contact of the processing liquid and the gas with the liquid surface is suppressed. As a result, it is possible to prevent the processing liquid containing bubbles from being supplied to the substrate.

The substrate processing apparatus may further include a controller for controlling the liquid supply. The liquid supply may further have a gas delivery pipe for supplying the gas to the tank via the gas discharge passage, and a pressure regulation part installed in the gas delivery pipe and configured to adjust the pressure by the gas in the container part. The controller may control the pressure regulation part so that the internal pressure of the container part gradually rises when the interior of the container part is pressurized from a state where the pressure is released. In this case, since the pressure is gradually applied to the processing liquid stored in the tank, it is possible to prevent foaming of the processing liquid when the pressure is applied.

A method of using a tank according to yet another embodiment of the present disclosure is a method of using a tank including a container part having an upper wall, a sidewall and a bottom wall and configured to store a processing liquid therein, a liquid discharge passage having a liquid discharge port installed at a position higher than a liquid surface of the processing liquid stored in the container part and configured to discharge the processing liquid into the container part, and a gas discharge passage having a gas discharge port installed at a position higher than the liquid surface and configured to discharge a gas into the container part. This method of using a tank includes discharging the processing liquid from the liquid discharge port so that the processing liquid is brought into contact with a portion above the liquid surface of the inner surface of the sidewall, and discharging the gas from the gas discharge port so that the gas is brought into contact with a portion above the liquid surface on the inner surface of the container part. In this case, similar to the above, the foaming of the processing liquid caused by direct contact of the processing liquid and the gas with the liquid surface is suppressed. As a result, it is possible to prevent the processing liquid containing bubbles from being supplied to the substrate.

A method of using a tank according to yet another embodiment of the present disclosure is a method of using a tank including a container part having an upper wall, a sidewall and a bottom wall and configured to store a processing liquid therein, a liquid discharge passage having a liquid discharge port installed at a position higher than a liquid surface of the processing liquid stored in the container part and configured to discharge the processing liquid into the container part, a gas discharge passage having a gas discharge port installed at a position higher than the liquid surface and configured to discharge a gas into the container part, and a degassing part for degassing the gas in the container part. This method of using a tank includes discharging the gas from the gas discharge port so that the gas is brought into contact with a portion above the liquid surface of the inner surface of the sidewall, while degassing the gas in the container part from the degassing part. For example, when the processing liquid in the container part is reduced, bubbles remaining on the inner surface of the sidewall can be removed by generation of an airflow by the gas discharge into the container part. That is, the bubbles in the tank can be removed.

Hereinafter, various exemplary embodiments will be described in detail with reference to the drawings. In the description, like elements or elements having like functions are denoted by like reference symbols and a repeated description thereof will be omitted.

[Substrate Processing System]

A substrate processing system 1 illustrated in FIG. 1 is a system which forms a photosensitive film on a substrate, exposes the photosensitive film, and develops the photosensitive film. The substrate to be processed is, for example, a semiconductor wafer W. The photosensitive film is, for example, a resist film. The substrate processing system 1 includes a coating and developing device 2 and an exposure device 3. The exposure device 3 performs an exposure process on the resist film (photosensitive film) formed on the wafer W (substrate). Specifically, an energy beam is irradiated to a portion to be exposed of the resist film by a method such as liquid immersion exposure or the like. The coating and developing device 2 performs a process of forming the resist film on a surface of the wafer W (substrate) before the exposure process by the exposure device 3, and performs a development process on the resist film after the exposure process.

[Substrate Processing Apparatus]

Figure 2:
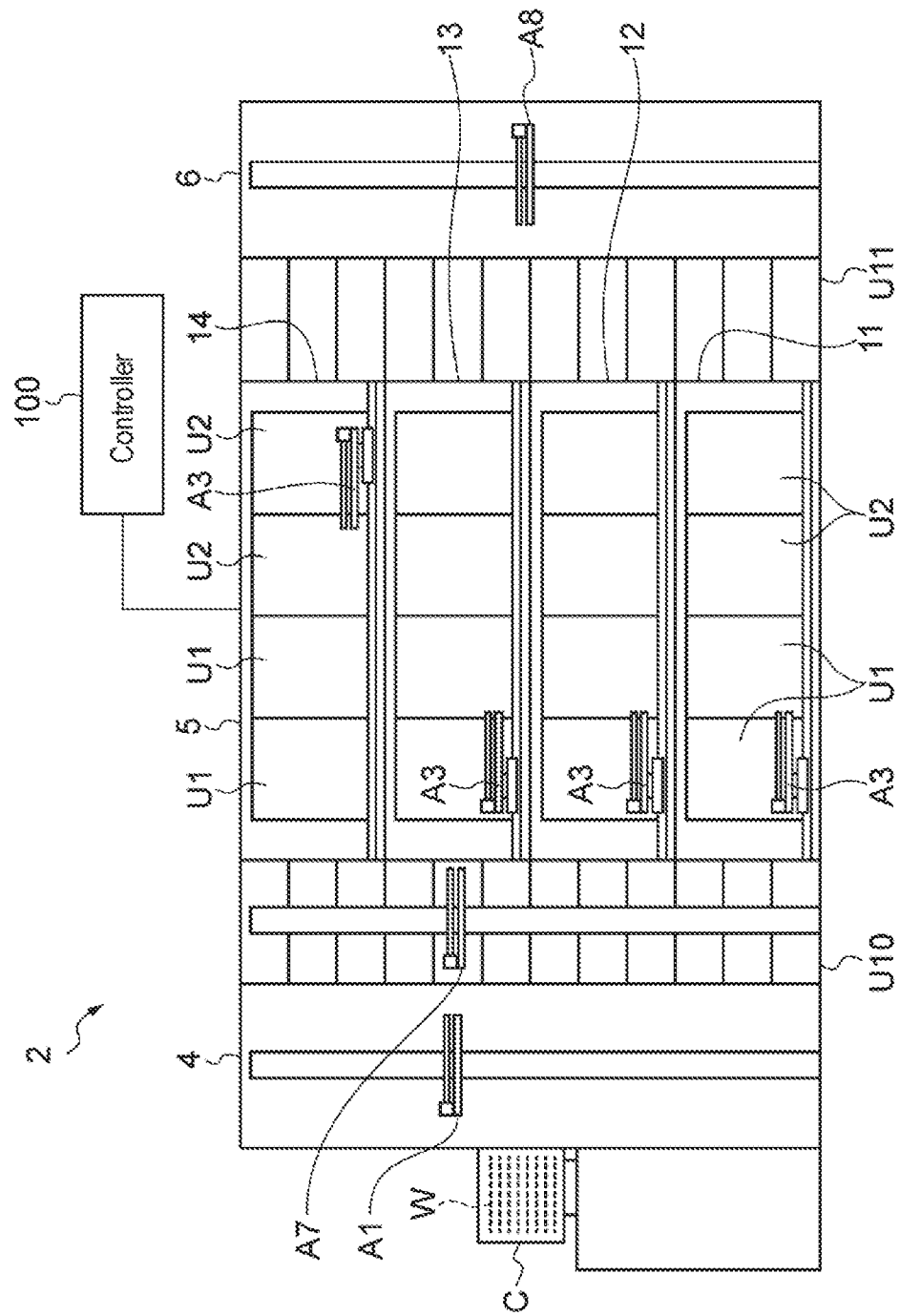
FIG. 2 is a schematic view illustrating an internal configuration of a coating and developing device.

Hereinafter, a configuration of the coating and developing device 2 will be described as an example of a substrate processing apparatus. As illustrated in FIGS. 1 and 2, the coating and developing device 2 includes a carrier block 4, a processing block 5, an interface block 6, and a controller 100.

The carrier block 4 introduces wafers W into the coating and developing device 2 and transfers the wafers W out of the coating and developing device 2. For example, the carrier block 4 can support a plurality of carriers C for the wafers W, and incorporates a transfer device A1 including a transfer arm. The carriers C accommodate, for example, a plurality of circular wafers W. The transfer device A1 takes out the wafers W from the carriers C and transfers them to the processing block 5, and receives the wafers W from the processing block 5 and returns the wafers W into the carriers C.

The processing block 5 has a plurality of processing modules 11, 12, 13, and 14. The processing modules 11, 12, and 13 incorporate coating units U1, heat treatment units U2, and transfer devices A3 including transfer arms for transferring the wafers W to these units.

The processing module 11 forms a lower layer film on the surface of each of the wafers W by the coating units U1 and the heat treatment units U2. The coating units U1 of the processing module 11 apply a processing liquid for forming the lower layer film onto the wafer W. The heat treatment units U2 of the processing module 11 perform various heat treatments associated with the formation of the lower layer film.

The processing module 12 forms a resist film on the lower layer film by the coating units U1 and the heat treatment units U2. The coating units U1 of the processing module 12 apply a processing liquid for forming the resist film onto the lower layer film. The heat treatment units U2 of the processing module 12 perform various heat treatments associated with the formation of the resist film.

The processing module 13 forms an upper layer film on the resist film by the coating units U1 and the heat treatment units U2. The coating units U1 of the processing module 13 apply a liquid for forming the upper layer film onto the resist film. The heat treatment units U2 of the treatment module 13 perform various heat treatments associated with the formation of the upper layer film.

The processing module 14 incorporates coating units U1, heat treatment units U2, and a transfer device A3 for transferring the wafers W to these units. The processing module 14 performs the development process on the resist film after exposure by the coating units U1 and the heat treatment units U2. The coating units U1 apply a developing solution onto the exposed surfaces of the wafers W. Furthermore, after the application process of the developing solution, the coating units U1 apply a chemical solution (processing liquid), and then rinses the applied developing solution with a rinsing liquid to perform the development process on the resist film. The heat treatment units U2 perform various heat treatments associated with the development process. Specific examples of the heat treatment may include heat treatment (post exposure bake: PEB) before the development process, heat treatment (post bake: PB) after the development process, and the like.

A shelf unit U10 is installed on the carrier block 4 side in the processing block 5. The shelf unit U10 is partitioned into a plurality of cells vertically arranged. A transfer device A7 including an elevating arm is installed near the shelf unit U10. The transfer device A7 moves the wafers W up and down between the cells of the shelf unit U10.

A shelf unit U11 is installed on the interface block 6 side in the processing block 5. The shelf unit U11 is partitioned into a plurality of cells vertically arranged.

The interface block 6 transfers the wafers W into and out of the exposure device 3. For example, the interface block 6 incorporates a transfer device A8 including a transfer arm, and is connected to the exposure device 3. The transfer device A8 transfers the wafers W arranged on the shelf unit U11 to the exposure device 3. The transfer device A8 receives the wafers W from the exposure device 3 and returns them to the shelf unit U11.

The controller 100 controls the coating and developing device 2 so as to execute the coating and developing process according to, for example, the following procedure. First, the controller 100 controls the transfer device A1 so as to transfer the wafers W in the carriers C to the shelf unit U10, and controls the transfer device A7 so as to arrange the wafers W in the cells for the processing module 11.

Next, the controller 100 controls the transfer device A3 so as to transfer the wafers W in the shelf unit U10 to the coating units U and the heat treatment units U2 in the processing module 11. Furthermore, the controller 100 controls the coating units U1 and the heat treatment units U2 so as to form the lower layer film on the surface of each of the wafers W. Thereafter, the controller 100 controls the transfer device A3 so as to return the wafer W on which the lower layer film is formed to the shelf unit U10, and controls the transfer device A7 so as to arrange the wafers W in the cells for the processing module 12.

Next, the controller 100 controls the transfer device A3 so as to transfer the wafers W in the shelf unit U10 to the coating units U1 and the heat treatment units U2 in the processing module 12. Furthermore, the controller 100 controls the coating unit U1 and the heat treatment unit U2 so as to form the resist film on the lower layer film of the wafers W. Thereafter, the controller 100 controls the transfer device A3 so as to return the wafers W to the shelf unit U10, and controls the transfer device A7 so as to arrange the wafers W in the cells for the processing module 13.

Next, the controller 100 controls the transfer device A3 so as to transfer the wafers W in the shelf unit U10 to each unit in the processing module 13. Furthermore, the controller 100 controls the coating units U1 and the heat treatment units U2 so as to form the upper layer film on the resist film of the wafers W. Thereafter, controller 100 controls the transfer device A3 so as to transfer wafers W to the shelf unit U11.

Next, the controller 100 controls the transfer device A8 so as to deliver the wafers W in the shelf unit U11 to the exposure device 3. Thereafter, the controller 100 controls the transfer device A8 so as to receive the exposed wafers W from the exposure device 3 and to arrange the same in the cells for the processing module 14 in the shelf unit U11.

Next, the controller 100 controls the transfer device A3 so as to transfer the wafers W in the shelf unit U11 to each unit in the processing module 14, and controls the coating units U1 and the heat treatment units U2 so as to perform the development process including a process of applying a developing solution, a chemical solution, and a rinsing liquid onto the resist film of the wafers W. Thereafter, controller 100 controls the transfer device A3 so as to return the wafers W to the shelf unit U10, and controls the transfer device A7 and the transfer device A1 so as to return the wafers W into the carriers C. The coating and developing process is completed as described above.

The specific configuration of the substrate processing apparatus is not limited to the configuration of the coating and developing device 2 exemplified above. The substrate processing apparatus may be of any type as long as it includes a coating unit for applying a processing liquid such as a chemical solution or the like, a processing liquid supply, and a controller for controlling them.

(Coating Unit)

Figure 3:
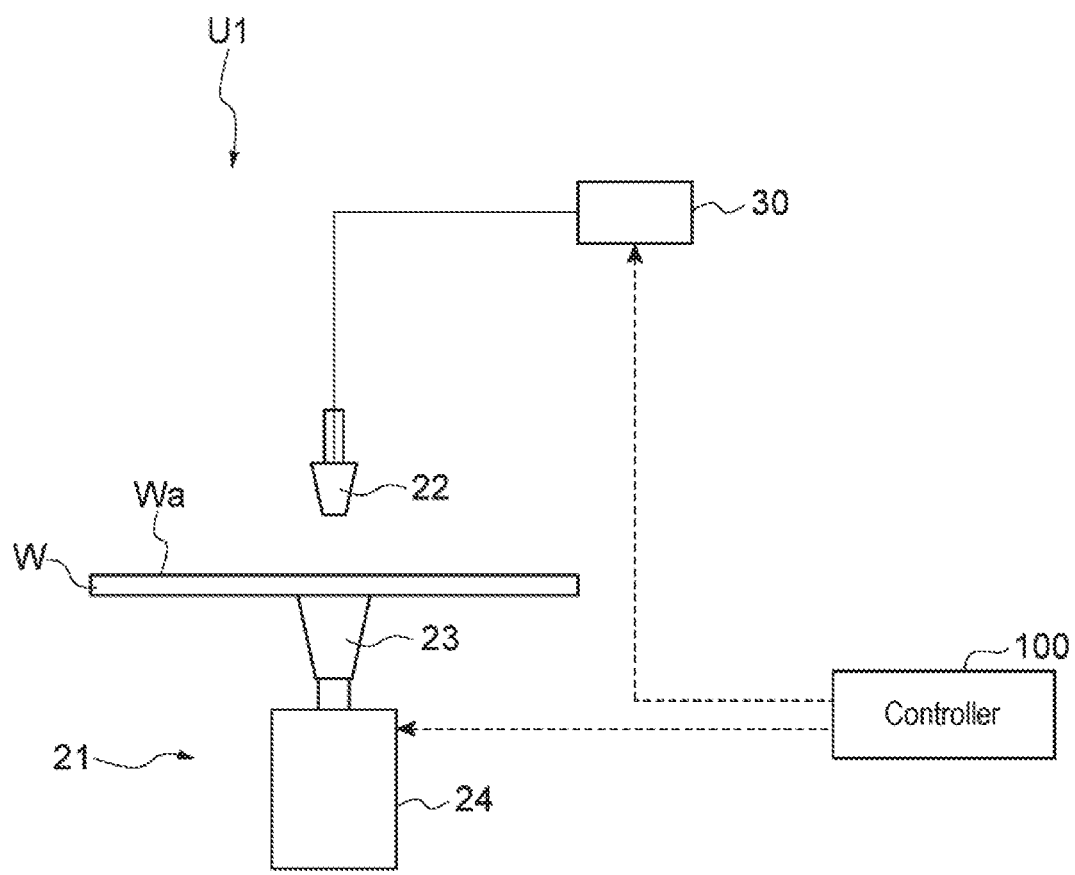
FIG. 3 is a schematic view illustrating a configuration of a coating unit.

Next, an example of a configuration of each of the plurality of coating units U1 in the processing module 14 will be described with reference to FIG. 3. The coating unit U1 illustrated in FIG. 3 is configured to apply a processing liquid to a surface Wa of a wafer W. The coating unit U1 includes a rotation holder 21, and a nozzle 22.

The rotation holder 21 holds and rotates the wafer W based on an operation instruction from the controller 100. The rotation holder 21 includes a holder 23 and a driving part 24. The holder 23 supports a central portion of the wafer W horizontally arranged with the surface Wa facing upward, and holds the wafer W by adsorption (for example, vacuum adsorption) or the like. The driving part 24 is a rotary actuator using, for example, an electric motor or the like as a power source, and rotates the holder 23 around a vertical rotary shaft. Accordingly, the wafer W rotates around the vertical rotary shaft.

The nozzle 22 discharges (supplies) the processing liquid onto the surface Wa of the wafer W. The nozzle 22 is arranged above the wafer W and discharges the processing liquid downward. Each coating unit U1 may include a nozzle movement mechanism (not shown) for moving the nozzle 22. The nozzle movement mechanism moves the nozzle 22 along a horizontal straight line passing through the rotary shaft using, for example, an electric motor or the like as a power source.

(Liquid Supply)

Figure 4:
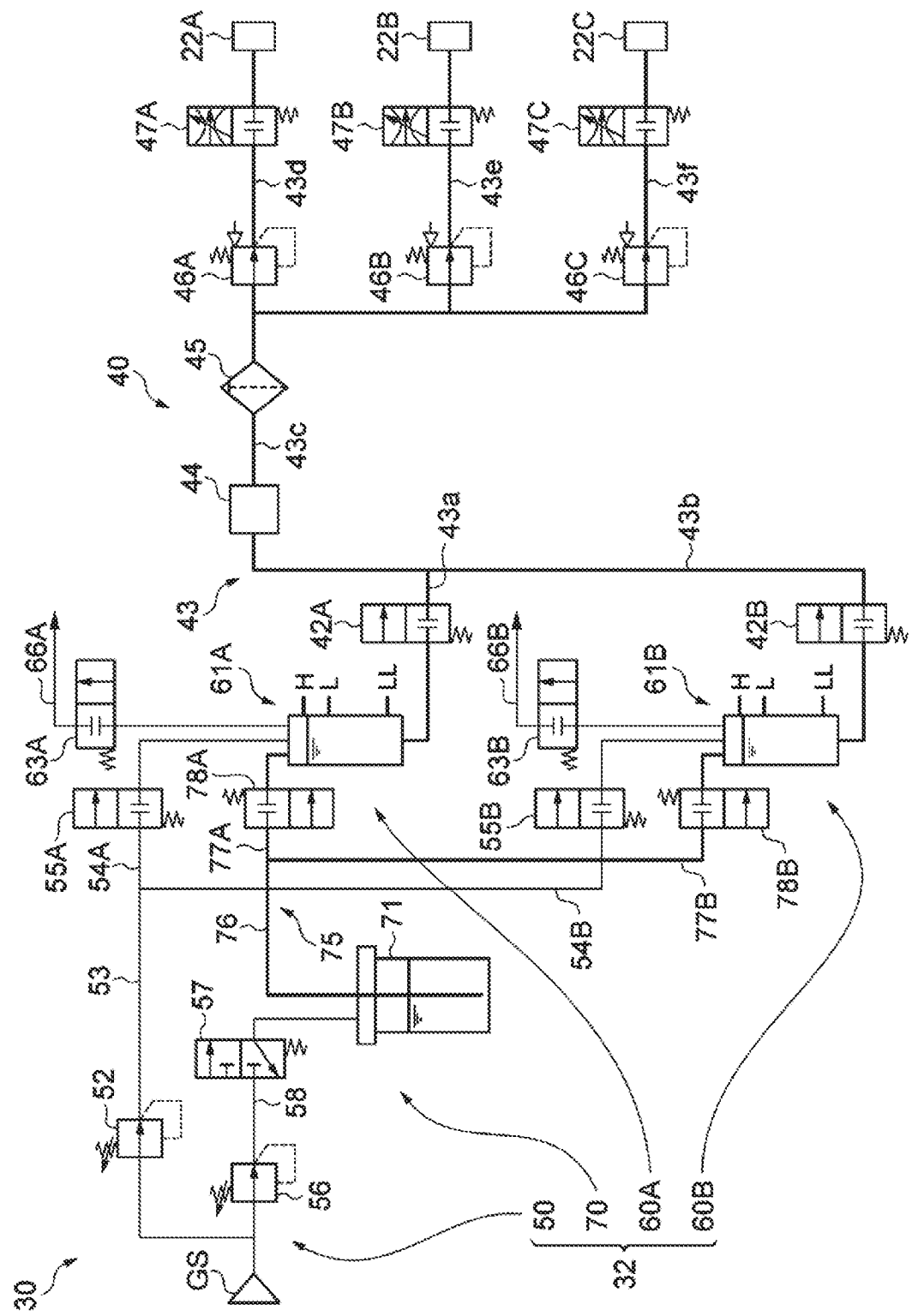
FIG. 4 is a schematic view illustrating a configuration of a liquid supply.

The processing module 14 includes a liquid supply 30 for supplying the processing liquid to the nozzle 22 of each of the plurality of coating units U1. FIG. 4 schematically illustrates the liquid supply 30 for supplying the processing liquid to respective nozzles 22 (nozzles 22A, 22B, and 22C) of three coating units U1 as an example. The processing liquid supplied by the liquid supply 30 may be a chemical solution used after application of a developing solution and before application of a rinsing liquid. The chemical solution supplied by the liquid supply 30 may include a surfactant or may include a water-soluble polymer. Examples of the water-soluble polymer may include a single polymer or a multiblock copolymer of a vinyl monomer containing a hydrophilic group, a polycondensation having a hydrophilic group, and the like. The chemical solution supplied by the liquid supply 30 may have a foaming property (a property of easily foaming). For example, the chemical solution supplied by the liquid supply 30 may have a property easier to foam than at least one of the developing solution and the rinsing liquid.

The liquid supply 30 includes a pressure delivery part 32 and a liquid feeding pipeline 40. The pressure delivery part 32 delivers the processing liquid to the liquid feeding pipeline 40 by applying pressure. The liquid feeding pipeline 40 is installed at the downstream side of the pressure delivery part 32, and guides the processing liquid delivered from the pressure delivery part 32 to the nozzle 22. For example, the pressure delivery part 32 includes a pressurization part 50, a plurality of (here, two) liquid feeding parts 60A and 60B, and a liquid replenishment part 70.

The pressurization part 50 pressurizes processing liquids in tanks 61A and 61B (as described herein below) toward the nozzle 22. The pressurization part 50 includes a pressurization source GS, pressurization pipes 53, 54A and 54B (gas delivery pipes), a pressure regulating valve 52, and valves 55A and 55B. The pressurization source GS can supply a gas (e.g., an inert gas) to the tanks 61A and 61B via the pressurization pipes 53, 54A and 54B. An example of the inert gas may include a nitrogen gas. One end of the pressurization pipe 53 is connected to the pressurization source GS and the other end of the pressurization pipe 53 is branched into the pressurization pipes 54A and 54B. The pressurization pipes 54A and 54B are connected to the tanks 61A and 61B, respectively.

The pressure regulating valve 52 is installed in the pressurization pipe 53. The pressure regulating valve 52 is, for example, an electronic valve, and operates based on an instruction from the controller 100. The pressure regulating valve 52 adjusts the internal pressure of the tanks 61A and 61B by adjusting the flow rate of the gas from the pressurization source GS into the tanks 61A and 61B.

The valves 55A and 55B are installed in the pressurization pipes 54A and 54B, respectively. The valves 55A and 55B are, for example, air operation valves. The valves 55A and 55B open and close flow passages in the pressurization pipes 54A and 54B according to an operation instruction from the controller 100. By closing the valves 55A and 55B, the pressure by the pressurization part 50 can be interrupted.

The liquid feeding parts 60A and 60B temporarily store the processing liquid delivered from the liquid replenishment part 70 as described herein below, and deliver the processing liquid in a pressurized state to the nozzle 22. The liquid feeding part 60A and the liquid feeding part 60B are substantially identically configured. The liquid feeding part 60A out of the liquid feeding parts 60A and 60B includes a tank 61A, a valve 63A, and a degassing pipe 66A.

The tank 61A has a function of temporarily storing the processing liquid. An upper portion of the tank 61A is connected to the pressure regulating valve 52 via the pressurization pipes 53 and 54A. Thus, the interior of the tank 61A can be pressurized by the pressurization part 50. The upper portion of the tank 61A is also connected to the degassing pipe 66A. An end of the degassing pipe 66A is opened to the outside of the tank 61A. A specific example of the tank 61A will be described later. In addition, the tank 61A will also be referred to as a "reservoir" or a "reservoir tank".

The valve 63A is installed in the degassing pipe 66A. The valve 63A is, for example, an air operation valve. The valve 63A opens and closes a flow passage in the degassing pipe 66A according to an operation instruction from the controller 100. By opening the valve 63A, it is possible to release the internal pressure of the tank 61A to the outside of the tank 61A (discharge the gas in the tank). By opening the valve 55A with the valve 63A installed in the degassing pipe 66A closed, the interior of the tank 61A is pressurized by the pressurization part 50. At this time, the internal pressure of the tank 61A is adjusted by the pressure regulating valve 52. As an example, the internal pressure of the tank 61A may be adjusted to several hundred kPa (e.g., 100 to 300 kPa). The internal pressure of the tank 61A may be adjusted according to the number of connected coating units U1.

The liquid feeding part 60B includes a tank 61B, a valve 63B, and a degassing pipe 66B. The liquid feeding part 60B is configured in the same manner as the liquid feeding part 60A, and therefore, a detailed description thereof will be omitted.

The liquid replenishment part 70 replenishes the processing liquid to the tanks 61A and 61B included in the liquid feeding parts 60A and 60B. The liquid replenishment part 70 includes a canister tank 71, a replenishment pipe 75, and a plurality of (here, two) valves 78A and 78B. The pressurization part 50 also has a function of pressurizing the interior of the canister tank 71. In order to pressurize the interior of the canister tank 71, the pressurization part 50 further includes a pressurization pipe 58 connected to the pressurization source GS, and a pressure regulating valve 56 and a valve 57 installed in the pressurization pipe 58.

The canister tank 71 stores a processing liquid for replenishment. The capacity of the canister tank 71 may be larger than the capacity of the tanks 61A and 61B. An upper portion of the canister tank 71 is connected to the pressurization source GS via the pressurization pipe 58. The canister tank 71 may be configured so that the processing liquid stored in the canister tank 71 is indirectly pressurized by the gas from the pressurization source GS. The processing liquid in the canister tank 71 is pressure-delivered to the tanks 61A and 61B via the replenishment pipe 75 by the pressure from the pressurization source GS. The replenishment pipe 75 includes a first portion 76 extending from near the bottom in the canister tank 71 to the outside of the canister tank 71, and second portions 77A and 77B branching from the first portion 76 and respectively connected to the liquid feeding parts 60A and 60B (tanks 61A and 61B).

The pressure regulating valve 56 adjusts the internal pressure of the canister tank 71 by adjusting the flow rate of the gas from the pressurization source GS to the canister tank 71. The pressure during the pressurization in the canister tank 71 may be lower than the internal pressures of the tanks 61A and 61B. As an example, the internal pressure of the canister tank 71 may be adjusted to several tens of kPa (e.g., 30 to 50 kPa). By opening the valve 57, the interior of the canister tank 71 is pressurized.

The valves 78A and 78B are installed in the second portions 77A and 77B of the replenishment pipe 75, respectively. The valve 78A opens and closes a flow passage in the second portion 77A according to an operation instruction from the controller 100. The valve 78B has the same configuration and function as those of the valve 78A. By closing both the valves 78A and 78B, the delivery of the processing liquid from the canister tank 71 can be interrupted. By opening the valve 78A with the interior of the canister tank 71 pressurized and the valve 78B closed, the processing liquid is supplemented (replenished) from the canister tank 71 into the tank 61A. Furthermore, by opening the valve 78B with the interior of the canister tank 71 pressurized and the valve 78A closed, the processing liquid is supplemented (replenished) from the canister tank 71 into the tank 61B.

The liquid feeding pipeline 40 guides the processing liquid delivered from the pressure delivery part 32 to each of the nozzles 22A, 22B, and 22C. The liquid feeding pipeline 40 includes a liquid feeding pipe 43, a plurality of (here, two) valves 42A and 42B, a degassing module 44, a filter 45, and a plurality of (here, three) pressure regulating valves 46A to 46C, and a plurality of (here, three) valves 47A to 47C.

The liquid feeding pipe 43 guides the processing liquid from the tank 61A of the liquid feeding part 60A to the nozzles 22A to 22C. Furthermore, the liquid feeding pipe 43 guides the processing liquid from the tank 61B of the liquid feeding part 60B to the nozzles 22A to 22C. The liquid feeding pipe 43 includes a plurality of first portions 43a and 43b respectively connected to lower portions of the tanks 61A and 61B, and a second portion 43c to which the first portions 43a and 43b joined to each other are connected. In addition, the liquid feeding pipe 43 includes a plurality of third portions 43d to 43f respectively branching from the second portion 43c toward the nozzles 22A to 22C.

The valves 42A and 42B correspond to the liquid feeding parts 60A and 60B (tanks 61A and 61B), respectively. The valve 42A is installed in the first portion 43a of the liquid feeding pipe 43. The valve 42A opens and closes a flow passage in the first portion 43*a* according to an operation instruction from the controller 100. The valve 42B is installed in the first portion 43*b*, and has the same configuration and function as those of the valve 42A. By closing both the valves 42A and 42B, the delivery of the processing liquid from both the tanks 61A and 61B can be interrupted. By opening the valve 42A with the valve 42B closed, the processing liquid is guided from the tank 61A toward the nozzle 22. By opening the valve 42B with the valve 42A closed, the processing liquid is guided from the tank 61B toward the nozzle 22.

The degassing module 44 is installed in the second portion 43*c* of the liquid feeding pipe 43. The degassing module 44 removes bubbles contained in the processing liquid flowing through the second portion 43*c*. In other words, the degassing module 44 removes the gas dissolved in the processing liquid. The degassing module 44 may remove bubbles using a separation membrane, and may include a hollow fiber membrane as the separation membrane. The outside of the hollow fiber membrane may be depressurized by a vacuum pump or the like. The configuration for removing bubbles is not limited thereto.

The filter 45 is installed at the downstream side of the degassing module 44 (on the side closer to the nozzle 22) in the second portion 43*c* of the liquid feeding pipe 43. The filter 45 collects dust contained in the processing liquid flowing through the second portion 43*c*. The filter 45 may be configured to collect dust in the processing liquid by a pressure filtration method.

The pressure regulating valves 46A, 46B, and 46C are installed in the third portions 43*d*, 43*e*, and 43*f*, respectively, of the liquid feeding pipe 43. The pressure regulating valve 46A adjusts the pressure applied to the processing liquid discharged from the nozzle 22A. The pressure regulating valve 46A operates based on an operation instruction from the controller 100. The pressure regulating valve 46A adjusts the flow rate of the processing liquid guided from one of the tanks 61A and 61B to the nozzle 22A to adjust the pressure applied to the processing liquid (discharge amount per unit time from the nozzle). The pressure regulating valves 46B and 46C have the same configuration and function as those of the pressure regulating valve 46A.

The valves 47A, 47B, and 47C are installed in the third portions 43*d*, 43*e*, and 43*f*, respectively, of the liquid feeding pipe 43. The valve 47A opens and closes a flow passage in the third portion 43*d* according to an operation instruction from the controller 100. The valves 47B and 47C have the same configuration and function as the valve 47A. By closing all of the valves 47A, 47B, and 47C, the processing liquid is not discharged from any of the nozzles 22A to 22C. Furthermore, by opening any one of the valves 47A, 47B, and 47C, the processing liquid is discharged from the nozzle 22 corresponding to that valve toward the wafer W.

In the liquid supply 30 configured as described above, the processing liquid is replenished from the canister tank 71 to at least one of the tanks 61A and 61B by the pressurization by the pressurization part 50 of the pressure delivery part 32. In the tanks 61A and 61B, the interior of the tanks is pressurized by the pressurization part 50 while the replenished processing liquid is temporarily stored. Then, from any one of the tanks 61A and 61B, the processing liquid pressurized in the corresponding tank is supplied to the nozzle 22 via the liquid feeding pipeline 40.

(Tank)

Figure 5:
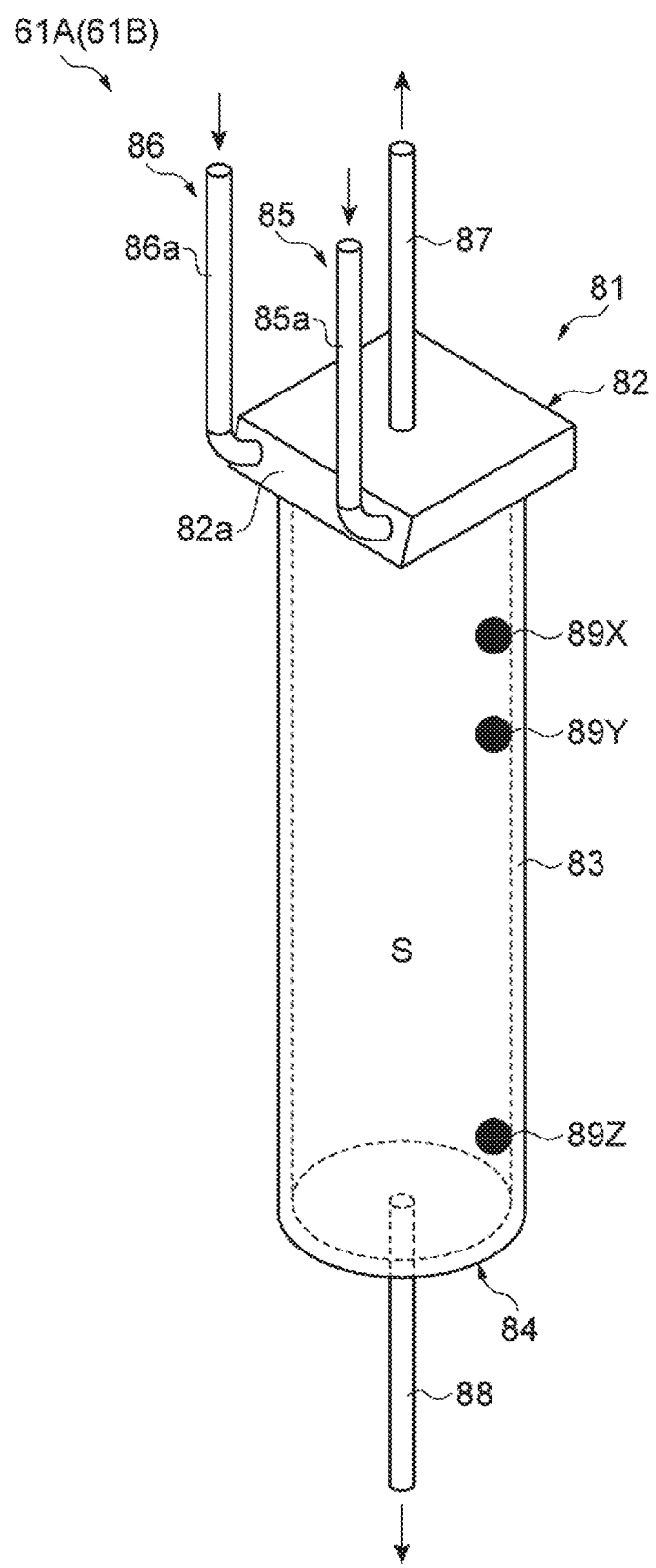
FIG. 5 is a perspective view schematically illustrating an example of a schematic configuration of a tank.

Next, an example of a configuration of the tanks 61A and 61B will be described with reference to FIGS. 5, 6A and 6B. FIG. 5 illustrates a schematic perspective view of the tank 61A (tank 61B). The tank 61A includes a container part 81, a liquid discharge passage 85, a gas discharge passage 86, a degassing passage 87, a liquid delivery passage 88, and a plurality of (in this example, three) liquid surface sensors 89X, 89Y, and 89Z. The tanks 61A and 61B have substantially the same configuration, and therefore, the tank 61A will be first described.

The container part 81 has an inner space S, and stores a processing liquid in the inner space S. A gas is further stored in the inner space S (in the container part 81) of the container part 81 in which the processing liquid is stored. A longitudinal direction of the container part 81 and the inner space S extends in the vertical direction (up and down on the paper of FIG. 5). The container part 81 and the inner space S may have, for example, a circular columnar shape. The container part 81 includes an upper wall 82, a sidewall 83, and a bottom wall 84 forming the inner space S.

The sidewall 83 forming the inner space S extends along the vertical direction. An inner surface of the sidewall 83 forms a side surface of the inner space S. In the example illustrated in FIG. 5, the sidewall 83 is formed so that the cross-sectional shape of the inner surface is circular in a direction (horizontal direction) orthogonal to the vertical direction. In other words, the sidewall 83 is formed in a cylindrical shape.

The upper wall 82 extends in the horizontal direction. The upper wall 82 is formed to be continuous with the sidewall 83 in an upper portion of the sidewall 83 so as to cover the upper end of the sidewall 83. That is, an inner surface of the upper wall 82 forms an upper surface of the inner space S. The upper wall 82 is formed in, for example, a flat plate shape. In the example illustrated in FIG. 5, the shape of the upper wall 82 is substantially square as viewed in a plan view, and the shape of the upper wall 82 is trapezoidal as viewed from the side. An outer edge of the upper wall 82 may surround an outer edge of the sidewall 83 as viewed in a plan view. A side surface 82*a*, which is one side surface of the upper wall 82, is inclined so that the width with respect to the opposite side surface is increased as it goes downward. Side surfaces other than the side surface 82*a* extend along the vertical direction.

The bottom wall 84 extends in the horizontal direction. The bottom wall 84 is formed to be continuous with the sidewall 83 in a lower portion of the sidewall 83 so as to close the lower end of the sidewall 83. That is, an inner surface of the bottom wall 84 forms a lower surface of the inner space S. The bottom wall 84 is formed in a flat plate shape. In the example illustrated in FIG. 5, the shape of the bottom wall 84 is circular as viewed in a plan view. An outer edge of the bottom wall 84 substantially coincides with the outer edge of the sidewall 83 as viewed in a plan view.

The liquid discharge passage 85 guides the processing liquid to the container part 81. The liquid discharge passage 85 is configured to discharge the processing liquid into the container part 81 (the inner space S). The liquid discharge passage 85 is formed in an upper portion of the container part 81. As will be described in detail later, the processing liquid is discharged from the liquid discharge passage 85 into the container part 81 in a direction inclined at a predetermined angle from above to below. One end of the liquid discharge passage 85 (an end formed outside the container part 81) is connected to the second portion 77A of the replenishment pipe 75 included in the liquid replenishment part 70 (see FIG. 4). In other words, the liquid replenishment part 70 replenishes the processing liquid into the container part 81 via the liquid discharge passage 85.

Figure 6A:
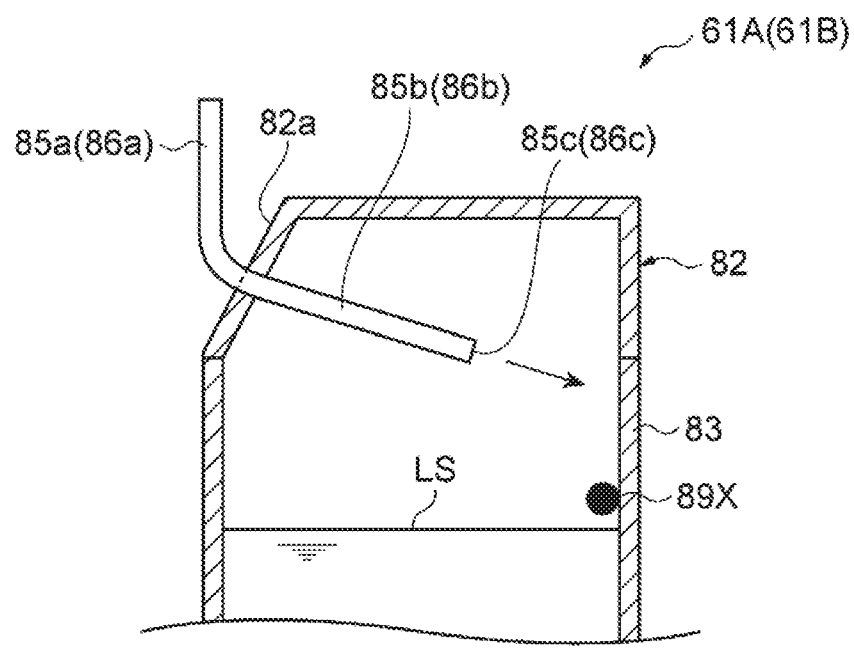
FIG. 6A is a schematic view illustrating a cross-sectional configuration of the tank as viewed from the side.
Figure 6B:
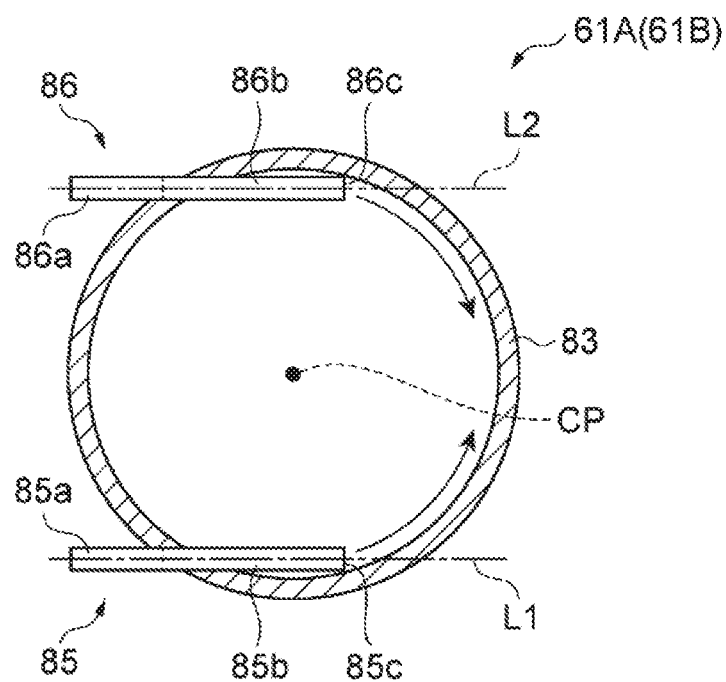
FIG. 6B is a schematic view illustrating a cross-sectional configuration of the tank as viewed from the top.

As illustrated in FIGS. 6A and 6B, the other end of the liquid discharge passage 85 (an end opposite to the aforementioned one end) is located in the container part 81. The liquid discharge passage 85 includes an outer discharge passage 85a, an inner discharge passage 85b, and a liquid discharge port 85c. Furthermore, a cross-sectional view of a plane including (the center of) the liquid discharge passage 85 in the tank 61A illustrated in FIG. 5 is schematically illustrated in FIG. 6A. The shape of the upper wall 82 of the tank 61A illustrated in FIG. 6A is different from the shape of the upper wall 82 illustrated in FIG. 5. A cross section in the horizontal direction of the tank 61A with the upper wall 82 in the example illustrated in FIG. 5 removed is schematically illustrated in FIG. 6B.

The outer discharge passage 85a is formed outside the container part 81. The outer discharge passage 85a is a flow passage formed in a tubular member for guiding the processing liquid toward the inner space S. In the example illustrated in FIG. 5, one end of the outer discharge passage 85a is located on the side surface 82a of the upper wall 82. A large portion of the tubular member forming the outer discharge passage 85a extends along the vertical direction.

As illustrated in FIG. 6A, the inner discharge passage 85b is formed inside the container part 81. The inner discharge passage 85b is a flow passage for guiding the processing liquid toward the inner space S, and communicates with the outer discharge passage 85a. The inner discharge passage 85b may be, for example, a flow passage formed by penetrating the upper wall 82 in a direction inclined from the vertical direction (from the side surface 82a to the lower surface of the upper wall 82). The inner discharge passage 85b may be, for example, a flow passage formed in a tubular member which penetrates the upper wall 82 (side surface 82a) and extends in a direction inclined from the vertical direction. One end of the inner discharge passage 85b is connected to one end of the outer discharge passage 85a on the side surface 82a. The liquid discharge port 85c is installed at the other end of the inner discharge passage 85b.

The liquid discharge port 85c is a portion of the inner discharge passage 85b of the liquid discharge passage 85, which is opened toward the inner space S. That is, the processing liquid guided in the liquid discharge passage 85 (the outer discharge passage 85a and the inner discharge passage 85b) is discharged from the liquid discharge port 85c into the inner space S. The liquid discharge port 85c may be, for example, an opening located at a lower surface portion of the upper wall 82 of the inner discharge passage 85b formed by penetrating the upper wall 82, or may be an opening in an end of a tubular member forming the inner discharge passage 85b. The liquid discharge port 85c is located in the inner space S. The direction in which the end of the inner discharge passage 85b including the liquid discharge port 85c extends is inclined by about 10° to 40° (e.g., 20°) with respect to the horizontal direction. Furthermore, the end of the inner discharge passage 85b including the liquid discharge port 85c is a portion having a length sufficient to define a discharge direction of the processing liquid discharged from the liquid discharge port 85c of the liquid discharge passage 85 (the inner discharge passage 85b).

The gas discharge passage 86 is configured in the same manner as the liquid discharge passage 85 except that the gas is guided instead of the processing liquid. That is, the gas discharge passage 86 is configured to guide the gas to the container part 81 and discharge the gas toward the interior of the container part 81 (the inner space S). The gas discharge passage 86 is formed in the upper portion of the container part 81. The gas is discharged from the gas discharge passage 86 into the container part 81 in a direction inclined at a predetermined angle from above to below. One end of the gas discharge passage 86 is connected to the pressurization pipe 54A (see FIG. 4). In other words, the pressurization part 50 delivers the gas into the container part 81 via the gas discharge passage 86 (pressurizes the interior of the container part 81). The other end of the gas discharge passage 86 is located inside the container part 81 (see FIGS. 6A and 6B). The gas discharge passage 86 includes an outer discharge passage 86a an inner discharge passage 86b, and a gas discharge port 86c.

The outer discharge passage 86a is installed outside the container part 81. The outer discharge passage 86a is a flow passage formed in a tubular member for guiding the gas toward the inner space S. In the example illustrated in FIG. 5, one end of the outer discharge passage 86a is located on the side surface 82a of the upper wall 82. A large portion of the tubular member forming the outer discharge passage 86a extends along the vertical direction.

The inner discharge passage 86b is installed in the container part 81. The inner discharge passage 86b is a flow passage for guiding the gas toward the inner space S, and communicates with the outer discharge passage 86a. The inner discharge passage 86b may be, for example, a flow passage formed by penetrating the upper wall 82 along a direction inclined from the vertical direction (from the side surface 82a to the lower surface of the upper wall 82). The inner discharge passage 86b may be, for example, a flow passage formed in a tubular member which penetrates the upper wall 82 (side surface 82a) and extends in a direction inclined from the vertical direction. One end of the inner discharge passage 86b is connected to one end of the outer discharge passage 86a on the side surface 82a. The gas discharge port 86c is installed at the other end of the inner discharge passage 86b.

The gas discharge port 86c is a portion of the inner discharge passage 86b of the gas discharge passage 86 which is opened toward the inner space S. That is, the gas guided inside the gas discharge passage 86 (the outer discharge passage 86a and the inner discharge passage 86b) is discharged from the gas discharge port 86c into the inner space S. The gas discharge port 86c may be, for example, an opening in the lower surface of the upper wall 82 of the inner discharge passage 86b formed as a through hole in the upper wall 82. Alternatively, the gas discharge port 86c may be, for example, an opening at an end of a tubular member forming the gas discharge port 86c. The gas discharge port 86c is located in the inner space S. The direction in which the end of the inner discharge passage 86b including the gas discharge port 86c extends is inclined by about 10 to 40° (e.g., 20°) with respect to the horizontal direction. Furthermore, the end of the inner discharge passage 86b including the gas discharge port 86c is a portion having a length sufficient to define a discharge direction of the gas discharged from the gas discharge port 86c of the gas discharge passage 86 (the inner discharge passage 86b).

The degassing passage 87 guides the gas to the outside of the container part 81 and discharges the gas from the interior of the container part 81 (the inner space S). The degassing passage 87 is installed in the upper portion (upper wall 82) of the container part 81. The degassing passage 87 is a flow passage formed in a tubular member for guiding the gas toward the outside of the container part 81. In the example illustrated in FIG. 5, the tubular member forming the degassing passage 87 extends along the vertical direction. One end of the degassing passage 87 penetrates the upper wall 82 along the vertical direction. That is, one end of the degassing passage 87 is in contact with the inner space S. The other end of the degassing passage 87 is connected to the degassing pipe 66A (see FIG. 4).

The liquid delivery passage 88 guides the processing liquid with pressure applied by the gas to the outside of the container part 81, and delivers the processing liquid from the interior of the container part 81 (inner space S). The liquid delivery passage 88 is installed in the lower portion (bottom wall 84) of the container part 81. The liquid delivery passage 88 is a flow passage formed in a tubular member for guiding the processing liquid toward the outside of the container part 81. In the example illustrated in FIG. 5, the tubular member forming the liquid delivery passage 88 extends along the vertical direction. One end of the liquid delivery passage 88 penetrates the bottom wall 84 along the vertical direction. That is, one end of the liquid delivery passage 88 is in contact with the inner space S. The other end of the liquid delivery passage 88 is connected to the first portion 43a (see FIG. 4) of the liquid feeding pipe 43.

The liquid surface sensors 89X, 89Y, and 89Z (a plurality of liquid surface detection parts) detect whether or not a liquid surface LS of the processing liquid stored in the container part 81 reaches a predetermined position. For example, the liquid surface sensors 89X, 89Y, and 89Z are installed on the inner surface of the sidewall 83. The liquid surface sensors 89X, 89Y, and 89Z are arranged sequentially from the top in the vertical direction. For example, the liquid surface sensors 89X, 89Y, and 89Z each detect that the liquid surface LS of the processing liquid reaches the predetermined position when the liquid surface LS of the processing liquid reaches their respective installation positions. A method of detecting the liquid surface LS by the liquid surface sensors 89X, 89Y, and 89Z may be any kind of method, and for example, a sensor for detecting the liquid surface LS based on a change in capacitance may be used. For example, the liquid surface sensors 89X, 89Y, and 89Z may continue to transmit signals to the controller 100 when the liquid surface LS reaches the predetermined position.

The liquid surface sensor 89X may be arranged near the upper end of the sidewall 83. In the tank 61A, the processing liquid may be stored up to the installation position (the detection position by the liquid surface sensor 89X) of the liquid surface sensor 89X. The liquid surface sensor 89Z may be arranged near the lower portion of the sidewall 83 (near the bottom wall 84). The liquid surface sensor 89Y is arranged between the liquid surface sensor 89X and the liquid surface sensor 89Z in the vertical direction. For example, the liquid surface sensor 89Y may be arranged closer to the liquid surface sensor 89X in the vertical direction. Hereinafter, for the sake of description, the liquid surface height of the liquid surface LS detected by the liquid surface sensor 89X will be referred to as a "first liquid surface height", the liquid surface height of the liquid surface LS detected by the liquid surface sensor 89Y will be referred to as a "second liquid surface height", and the liquid surface height of the liquid surface LS detected by the liquid surface sensor 89Z will be referred to as a "third liquid surface height".

The tank 61B includes the container part 81, the liquid discharge passage 85, the gas discharge passage 86, the degassing passage 87, the liquid delivery passage 88, and the plurality of (in this example, three) liquid surface sensors 89X, 89Y, and 89Z. The tank 61B is configured in the same manner as the tank 61A, and therefore, a detailed description of the tank 61B will be omitted. The liquid discharge passage 85 of the tank 61B is connected to the second portion 77B of the replenishment pipe 75 included in the liquid replenishment part 70. Furthermore, the gas discharge passage 86 of the tank 61B is connected to the pressurization pipe 54B included in the pressurization part 50. In addition, the liquid delivery passage 88 is connected to the first portion 43b of the liquid feeding pipe 43.

In the tanks 61A and 61B having the aforementioned configuration, the liquid discharge port 85c from which the processing liquid is discharged and the gas discharge port 86c from which the gas is discharged are located at substantially the same height. The liquid discharge port 85c and the gas discharge port 86c are arranged at positions higher than the first liquid surface height detected by the liquid surface sensor 89X. For example, the liquid discharge port 85c and the gas discharge port 86c are arranged at positions higher than the liquid surface sensor 89X. The direction in which the end of the inner discharge passage 85b including the liquid discharge port 85c extends, and the direction in which the end of the inner discharge passage 86b including the gas discharge port 86c extends substantially coincide with each other. Both the processing liquid from the liquid discharge port 85c and the gas from the gas discharge port 86c are discharged in a downward oblique orientation. As viewed in a plan view, the discharge direction (orientation) of the processing liquid discharged from the liquid discharge port 85c and the discharge direction (orientation) of the gas discharged from the gas discharge port 86c are substantially identical to each other (orientation from left to right on the paper of FIG. 6B).

The arrangements of the liquid discharge passage 85 and the gas discharge passage 86 in the tanks 61A and 61B will be described. In the example illustrated in FIG. 6B, the positions of the liquid discharge port 85c and the gas discharge port 86c in the direction in which the liquid discharge passage 85 (the gas discharge passage 86) extends are substantially identical to each other as viewed in a plan view. As viewed in a plan view, an outer corner portion of the leading end (the liquid discharge port 85c) of the inner discharge passage 85b is connected to the inner surface of the sidewall 83. The processing liquid discharged from the liquid discharge port 85c into the inner space S is brought into contact with the inner surface of the sidewall 83. Specifically, the processing liquid discharged from the liquid discharge port 85c is brought into contact with a portion above the first liquid surface height of the inner surface of the sidewall 83. Furthermore, the internal pressure of the canister tank 71 when the processing liquid is replenished into the tank is adjusted such that the processing liquid discharged from the liquid discharge port 85c is brought into contact with the aforementioned portion of the sidewall 83.

As viewed in a plan view, an outer corner portion of the leading end (the gas discharge port 86c) of the inner discharge passage 86b is connected to the inner surface of the sidewall 83. The gas discharged from the gas discharge port 86c into the inner space S is brought into contact with the inner surface of the container part 81. Specifically, the gas discharged from the gas discharge port 86c is brought into contact with a portion above the first liquid surface height of the inner surface of the container part 81 (the upper wall 82 and the sidewall 83). For example, similar to the liquid discharge passage 85, the gas discharged from the gas discharge passage 86 is brought into contact with a portion above the first liquid surface height of the inner surface of the sidewall 83. Furthermore, the flow rate of the gas is adjusted by the pressure regulating valve 52 such that the gas discharged from the gas discharge port 86c is brought into contact with the aforementioned portion of the container part 81.

As illustrated in FIG. 6B, a virtual line L1 extending in the extension direction of the end of the inner discharge passage 85b of the liquid discharge passage 85 including the liquid discharge port 85c is not orthogonal to the inner surface of the sidewall 83, as viewed in a plan view. Therefore, the processing liquid discharged from the liquid discharge port 85c flows toward the liquid surface LS while rotating along the inner surface of the sidewall 83. A virtual line L2 extending in the extension direction of the end of the inner discharge passage 86b of the gas discharge passage 86 including the gas discharge port 86c is not orthogonal to the inner surface of the sidewall 83. Therefore, the gas discharged from the gas discharge port 86c flows while rotating along the inner surface of the sidewall 83. Furthermore, the liquid discharge port 85c and the gas discharge port 86c are opposite to each other with the center CP in the container part 81 interposed therebetween, as viewed in a plan view. The center CP in the container part 81 is constituted by a center position of a region surrounded by the sidewall 83 in a cross section orthogonal to the vertical direction, and extends in the vertical direction. As described above, the liquid discharge port 85c and the gas discharge port 86c are respectively located in two regions divided by a plane including the center CP.

(Controller)

The controller 100 partially or entirely controls the coating and developing device 2. The controller 100 is configured by one or more control computers. For example, the controller 100 includes a circuit configured by one or more processors, a memory, a storage, a timer, and an input/output port. The storage has, for example, a non-transitory computer-readable storage medium such as a hard disk or the like. The storage medium stores a program for causing the controller 100 to execute a procedure for using the tank as described herein below. The storage medium may be a removable medium such as a nonvolatile semiconductor memory, a magnetic disc, an optical disc or the like. The memory temporarily stores the program loaded from the storage medium of the storage and operation results by the processor. The processor executes the program in cooperation with the memory. The timer measures an elapsed time by counting, for example, a reference pulse of a constant period. The input/output port performs input and output of an electric signal to and from a unit or a device to be controlled according to a command from the processor.

[Method for Using the Tank]

Next, an example of a procedure (method) for using the tanks 61A and 61B will be described with reference to FIGS. 7 and 8. FIG. 7 illustrates a timing chart illustrating an example of various operations in the liquid supply 30 as the procedure for using the tanks 61A and 61B. In FIG. 7, "tank1" indicates the tank 61A, and "tank2" indicates the tank 61B. In FIG. 7, various operations in periods T1 to T5 in which the use states of the tanks 61A and 61B are different from each other are illustrated. In the example illustrated in FIG. 7, from any of the nozzles 22, first discharge is performed in the period T1, second discharge is performed in the period T2, third discharge is performed in the period T3, and fourth discharge is performed in the period T4. Furthermore, the timings and number of times of discharges from the nozzles 22 are not limited to the example illustrated in FIG. 7.

In FIG. 7, "Canister Press" indicates a time when the interior of the canister tank 71 is pressurized to replenish the processing liquid from the liquid replenishment part 70 to any one of the tanks 61A and 61B (when the valve 57 is opened). "tank1 Press" and "tank2 Press" indicate times when the interiors of the tanks 61A and 61B are pressurized (when the valves 55A and 55B are opened). "tank1 Drain" and "tank2 Drain" indicate times when the internal pressures of the tanks 61A and 61B are released (when the valves 63A and 63B are opened). "tank1 In" and "tank2 In" indicate times when the processing liquid is supplied (discharged) into the tanks 61A and 61B (when the valves 78A and 78B are opened). "tank1 Out" and "tank2 Out" indicate times of states where the processing liquid can be delivered from the tanks 61A and 61B (timings when the valves 42A and 42B are opened). "Dispense" indicates a time when the processing liquid is discharged from any of the nozzles 22 toward the wafer W (when any of the valves 47A, 47B, and 47C is opened).

Furthermore, in FIG. 7, transitions of the detection results of the liquid surface sensors 89X, 89Y, and 89Z indicating remaining amounts of the processing liquids in the tanks 61A and 61B are illustrated. "tank1 H" and "tank2 H" indicate times when the liquid surface sensor 89X of each of the tanks 61A and 61B detects that the liquid surface LS reaches the first liquid surface height. "tank1 L" and "tank2 L" indicate times when the liquid surface sensor 89Y of each of the tanks 61A and 61B detects that the liquid surface LS reaches the second liquid surface height. "tank LL" and "tank2 LL" indicate times when the liquid surface sensor 89Z of each of the tanks 61A and 61B detects that the liquid surface LS reaches the third liquid surface height.

In the present embodiment, the controller 100 controls the liquid supply 30 so that the processing liquid stored in any one of the tank 61A and the tank 61B is supplied to the nozzle 22. Furthermore, when the liquid surface LS is reduced to a predetermined position (for example, the second liquid surface height detected by the liquid surface sensor 89Y) in any one of the tanks 61A and 61B, the controller 100 controls the liquid supply 30 so that replenishment of the processing liquid from the liquid replenishment part 70 into the corresponding tank starts. At a time when the replenishment of the processing liquid into any one of the tanks 61A and 61B starts, the controller 100 controls the liquid supply 30 so that the processing liquid is supplied from the tank (the other tank), which is not the replenishment target, to the nozzle 22.

More specifically, referring to FIG. 7, in the period T1, the processing liquid is supplied from the tank 61A to the nozzle 22 (the processing liquid in the tank 61A is used for substrate processing), and the processing liquid is not supplied from the tank 61B. At this time, in both the tanks 61A and 61B, the interiors of the tanks are continued to be pressurized by the pressurization part 50. In this period T1, the discharge of the processing liquid from any of the nozzles 22 toward the wafer W (first discharge) is performed, and the liquid surface LS is lower than the second liquid surface height by the reduction of the processing liquid in the tank 61A.

In the period T2, when it is detected that the liquid surface LS is lower than the second liquid surface height in the tank 61A, the controller 100 switches the supply source of the processing liquid discharged from the nozzle 22 from the tank 61A to the tank 61B. Specifically, the controller 100 performs control so that the processing liquid is replenished into the tank 61A, while the processing liquid can be discharged toward the wafer W by the processing liquid from the tank 61B. Time t1 indicates a time when the switching of the tank starts. When the tank is switched, the controller 100 releases the internal pressure of the tank 61A

(opens the valve 63A) before starting the replenishment of the processing liquid into the tank 61A. This prevents backflow of the processing liquid caused because the internal pressure of the tank 61A is higher than the pressure of the canister tank 71. Furthermore, after the replenishment of the processing liquid into the tank 61A is completed (after time t2), the controller 100 controls the liquid supply 30 so that the internal pressure of the tank 61A gradually rises. In FIG. 7, the inclined raised part at the end of the period T2 of the timing chart indicated by "tank1 Press" indicates that the internal pressure of the tank 61A gradually rises. When the processing liquid is discharged from the nozzle 22 to the wafer W during the period T2 (when the second discharge is performed), the processing liquid in the tank 61B is used.

An example of a replenishment procedure (replenishment process) for the tank in the period T2 will now be described in detail with reference to a flowchart in FIG. 8. First, the controller 100 determines whether or not it is necessary to replenish the processing liquid into the tank 61A (step S01). For example, at step S01, the controller 100 waits until the processing liquid in the tank 61A is lower than a reference liquid surface height. The reference liquid surface height may be set in advance by an operator as a timing when the replenishment of the processing liquid into the tank 61A starts. For example, the controller 100 may determine that the processing liquid in the tank 61A is lower than the reference liquid surface height by detecting that the liquid surface LS is lower than the second liquid surface height by the liquid surface sensors 89X, 89Y, and 89Z in the tank 61A (step S01: "YES").

Next, the controller 100 performs a control so that the processing liquid can be supplied from the tank 61B to the nozzle 22 (step S02). At step S02, the controller 100 switches the valve 42B from a closed state to an open state. Then, the controller 100 performs control so that the processing liquid cannot be supplied from the tank 61A to the nozzle 22 (step S03). At step S03, the controller 100 switches the valve 42A from an open state to a closed state. By executing steps S02 and S03, the supply source of the processing liquid discharged to the wafer W is switched from the tank 61A to the tank 61B. Furthermore, the controller 100 pressurizes the interior of the canister tank 71 by opening the valve 57 according to the processing of steps S02 and S03.

Next, the controller 100 performs a control so that the pressurization in the tank 61A is released (step S04). At step S04, the controller 100 switches the valve 63A from a closed state to an open state. Thus, the internal pressure of the tank 61A is released.

Next, the controller 100 performs a control so that the processing liquid is supplied (replenished) into the tank 61A (step S05). At step S05, the controller 100 controls the supply of the processing liquid into the tank 61A. Specifically, first, the controller 100 starts the supply of the processing liquid into the tank 61A by switching the valve 78A from a closed state to an open state (by opening the valve 78A). In other words, the controller 100 performs a control so that the processing liquid is discharged into the container part 81 via the liquid discharge passage 85 in the tank 61A. When it is detected that the liquid surface LS of the processing liquid in the tank 61A reaches the first liquid surface height, the controller 100 stops the supply of the processing liquid into the tank 61A. Specifically, the controller 100 switches the valve 78A and the valve 63A from an open state to a closed state (closes the valves 78A and 63A). Furthermore, the controller 100 releases the pressurization in the canister tank 71 by closing the valve 57 according to the stop of the supply of the processing liquid.

Next, the controller 100 performs a control so that the interior of the tank 61A is pressurized (steps S06 and S07). At step S06, the controller 100 performs control so that pressurization of the interior of the tank 61A starts. In other words, the controller 100 starts control to discharge the gas into the container part 81 via the gas discharge passage 86 in the tank 61A. At step S07, the controller 100 continues to raise the pressure until the interior of the tank 61A reaches a predetermined pressure. For example, the controller 100 gradually raises the internal pressure of the tank 61A by the pressure regulating valve 52 by switching the valve 55A from a closed state to an open state (by opening the valve 55A). Alternatively, the controller 100 gradually raises the internal pressure of the tank 61A by gradually switching the valve 55A from a closed state to an open state while keeping a set value of the pressure by the pressure regulating valve 52 constant. In addition, the controller 100 may continue to raise the internal pressure of the tank 61A until the set value by the pressure regulating valve 52 reaches a predetermined value, or until the valve 55A is completely opened. By raising the internal pressure of the tank 61A to a predetermined pressure, the replenishment process for the tank 61A is completed.

Returning to FIG. 7, in the period T3, the processing liquid is supplied from the tank 61B to the nozzle 22 (the processing liquid in the tank 61B is used for the substrate processing), and the processing liquid is not supplied from the tank 61A. In this period T3, the processing liquid in the tank 61A is not used for the substrate processing, but the pressurized state is continued in the tank 61A. During the period T3, the processing liquid is discharged from any of the nozzles 22 toward the wafer W (third discharge), and the liquid surface LS becomes lower than the second liquid surface height by the reduction of the processing liquid in the tank 61B.

When it is detected that the liquid surface LS is lower than the second liquid surface height, the controller 100 performs switching from the tank 61B to the tank 61A (time 3). That is, the controller 100 executes a replenishment process for the tank 61B in the period T4. The replenishment of the processing liquid into the tank 61B is performed in the same manner as the replenishment of the processing liquid into the tank 61A. When the pressurization of the interior of the tank 61B starts at time t4 in the period T4, the controller 100 gradually raises the internal pressure of the tank 61B. In the period T4, the processing liquid in the tank 61A is used for discharging the processing liquid from any of the nozzles 22 toward the wafer W (fourth discharge).

After the replenishment of the processing liquid into the tank 61B, in the period T5, the processing liquid is supplied from the tank 61A to the nozzle 22 (the processing liquid in the tank 61A is used for the substrate processing) and the interior of the tank 61B is pressurized, but the processing liquid is not supplied from the tank 61B. That is, the processing in the period T5 is similar to the processing in the period T1. Thereafter, the same processing as in the periods T2 to T4 is repeated.

[Operation]

In the tanks 61A and 61B included in the coating and developing device 2 according to the aforementioned embodiment, the processing liquid discharged from the liquid discharge port 85c is brought into contact with a portion above the liquid surface LS of the inner surface of the sidewall 83 of the container part 81. Furthermore, the gas discharged from the gas discharge port 86c is brought into contact with a portion above the liquid surface LS of the inner surface of the container part 81. Therefore, the discharged processing liquid and gas are supplied into the container part 81 without direct contact with the liquid surface LS of the processing liquid already stored in the container part 81. Thus, the foaming of the processing liquid caused by direct contact of the processing liquid and the gas with the liquid surface LS is suppressed. As a result, in the liquid supply 30 including the tanks 61A and 61B, the processing liquid containing bubbles can be prevented from flowing at the downstream side of the tanks 61A and 61B, thereby preventing the processing liquid containing bubbles from being supplied to the wafer W.

As the tank for temporarily storing the processing liquid, a configuration of discharging the processing liquid and the gas downward along the vertical direction into the container may be considered. In this configuration, the discharged processing liquid and gas are directly brought into contact with the liquid surface of the processing liquid already stored in the container part. In this case, a strong physical force may be applied to the processing liquid in the container part, causing foaming. On the other hand, in the tanks 61A and 61B, since the processing liquid and gas being discharged are not directly brought into contact with the liquid surface as described above, the force applied to the processing liquid in the container part 81 is weakened, thereby suppressing the foaming of the processing liquid in the container part. Furthermore, by supplying the processing liquid to the nozzle 22 by the liquid supply 30 including the tanks 61A and 61B, it is possible to configure a supply system separately from another supply system which supplies the processing liquid to the nozzle by a pump or the like.

In the aforementioned embodiment, the extension direction of the end of the liquid discharge passage 85 including the liquid discharge port 85c is inclined to the vertical direction. In this case, the component of the flow velocity of the processing liquid along the vertical direction is reduced, compared with the case where the processing liquid is discharged downward along the vertical direction. Therefore, since the force acting downward in the vertical direction can be reduced when the processing liquid supplied from the liquid discharge passage 85 is brought into contact with the processing liquid already stored in the container, the foaming of the processing liquid caused by the discharge of the processing liquid is more reliably suppressed. Furthermore, in the aforementioned embodiment, the extension direction of the end of the gas discharge passage 86 including the gas discharge port 86c is inclined to the vertical direction. In this case, since the component of the flow velocity of the gas along the vertical direction is reduced compared with the case where the gas is discharged downward along the vertical direction, the forming of the processing liquid caused by the discharge of the gas is more reliably suppressed.

In the aforementioned embodiment, the cross section of the inner surface of the sidewall 83 is circular in a plane intersecting the vertical direction. Furthermore, both the extension direction of the end of the liquid discharge passage 85 including the liquid discharge port 85c and the extension direction of the end of the gas discharge passage 86 including the gas discharge port 86c are not orthogonal to the inner surface of the sidewall 83, as viewed in a plan view. With this configuration, the processing liquid discharged from the liquid discharge port 85c and the gas discharged from the gas discharge port 86c both move in the inner space S while rotating along the inner surface of the sidewall 83. Therefore, the discharged processing liquid and gas are more reliably prevented from directly making contact with the liquid surface LS of the processing liquid stored in the container part 81. As a result, the foaming of the processing liquid caused by direct contact of the processing liquid and the gas with the liquid surface LS is more reliably suppressed.

In the aforementioned embodiment, the liquid discharge port 85c and the gas discharge port 86c are opposite to each other with the center CP in the container part 81 interposed therebetween, as viewed in a plan view. In this case, the processing liquid discharged from the liquid discharge port 85c is supplied into the container part 81 without contact with the gas discharge passage 86 including the gas discharge port 86c. As a result, it is possible to prevent the foaming of the processing liquid caused by contact with another member until the processing liquid discharged from the liquid discharge port 85c reaches the processing liquid in the container part 81.

In the aforementioned embodiment, the tanks 61A and 61B include the plurality of liquid surface sensors 89X, 89Y, and 89Z for detecting that the height of the liquid surface LS reaches predetermined positions (first, second, and third liquid surface heights), respectively. The predetermined positions at which the plurality of respective liquid surface sensors 89X, 89Y, and 89Z detect the liquid surface heights are lower than the liquid discharge port 85c, the gas discharge port 86c, a position at which the processing liquids discharged from the liquid discharge port 85c is brought into contact with the sidewall 83, and a position at which the gas discharged from the gas discharge port 86c is brought into contact with the container part 81. In this case, for example, by setting the processing liquid to be stored up to the first liquid surface height, it is possible to more reliably prevent the gas and the processing liquid discharged into the container part 81 at the liquid surface height of the processing liquid in the container part 81 from directly making contact with the liquid surface LS.

In the aforementioned embodiment, the coating and developing device 2 includes the controller 100 which controls the liquid supply 30. The liquid supply 30 has the pressurization pipe 53 for supplying the gas to the tanks 61A and 61B via the gas discharge passage 86, and a pressure regulation part (for example, the pressure regulating valve 52) installed in the pressurization pipe 53 and configured to adjust the pressure by the gas in the container part 81. When the interior of the container part 81 is pressurized from the state where the pressure is released, the controller 100 controls the pressure regulation part so that the internal pressure of the container part 81 gradually rises. In this case, since the pressure is gradually applied to the processing liquid stored in the tanks 61A and 61B, it is possible to prevent the foaming of the processing liquid when the pressure is applied.

The embodiment disclosed above should be considered as illustrative and not restrictive in all respects. The aforementioned embodiment may be omitted, replaced, or modified in various forms without departing from the scope and spirit of the accompanying claims.

EXEMPLARY MODIFICATIONS

Modification 1 of Method of Using the Tank

An exemplary modification of the method of using the tanks 61A and 61B will be described with reference to FIG. 9. FIG. 9 illustrates a defoaming procedure for bubbles adhered to the inner surface of the sidewall 83 of the container part 81 as a method of using a tank according to a first modification. Examples of the bubbles adhered to the sidewall 83 may include bobbles of a processing liquid generated in the container part 81 and bubbles of a processing liquid generated in a tank or a pipe at the upstream side of the tanks 61A and 61B.

In the defoaming procedure according to the first modification, the controller 100 discharges the gas from the gas discharge port 86c so that the gas is brought into contact with a portion above the liquid surface LS of the inner surface of the sidewall 83, while degassing the gas in the container part 81 from the degassing passage 87 (discharge part). At this time, the controller 100 supplies the gas at a weak pressure (e.g., 10 to 20 kPa) into the tanks 61A and 61B (container part 81) while keeping the valves 63A and 63B opened with the valves 78A and 78B closed. Due to this supply of the gas, an airflow FG, which flows while rotating along the inner surface of the sidewall 83, is generated in the container part 81. Thus, bubbles B adhered to a portion of the sidewall 83 located above the liquid surface LS are degassed together with the airflow FG via the degassing passage 87 (degassing pipes 66A and 66B), or are crushed by the airflow FG to be removed. A degassing port of the degassing passage 87 may be installed at the center of a region surrounded by the sidewall 83 as viewed from the top, i.e., at the center of the upper wall 82. In this case, an airflow of the upward gas discharged from the degassing passage 87 is formed at the center of the tanks 61A and 61B as viewed from the top, making it difficult to interfere with the airflow FG. Therefore, the airflow FG is likely to be formed in a regular state along the sidewall 83. Thus, the bubbles B are more reliably removed by the airflow FG.

In this method of using the tank, even if the bubbles remain on the inner surface of the sidewall 83 when the processing liquid in the container part 81 is reduced, the airflow FG due to the gas supply is generated in the container part 81, thus discharging the bubbles remaining on the inner surface of the sidewall 83. That is, defoaming in the tanks 61A and 61B can be performed.

Modification 2 of Method of Using the Tank

Another exemplary modification of the method of using the tank will be described with reference to FIGS. 10A to 10D, and 11. As a method of using a tank according to a second modification, a procedure for using the tank when the processing liquid in the canister tank 71, which is a replenishment source of the processing liquid, needs to be replenished during a replenishment process of the processing liquid for the tank 61A will be described.

Figure 10A:
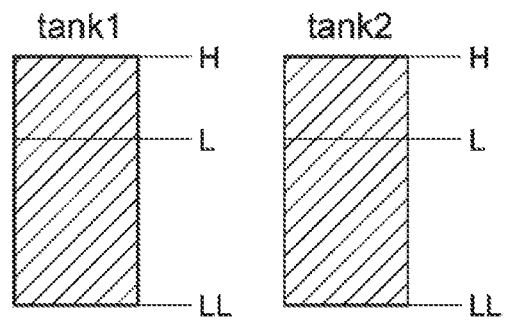
FIGS. 10A to 10D are diagrams illustrating an example of a procedure for using a processing liquid in the tank.
Figure 10B:
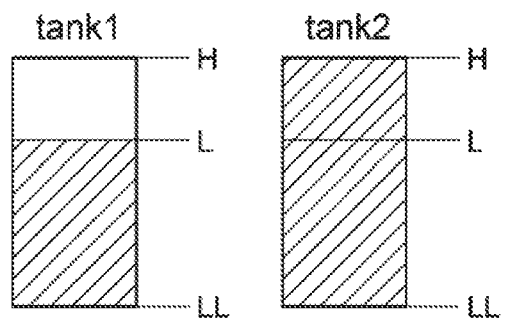
Figure 10C:
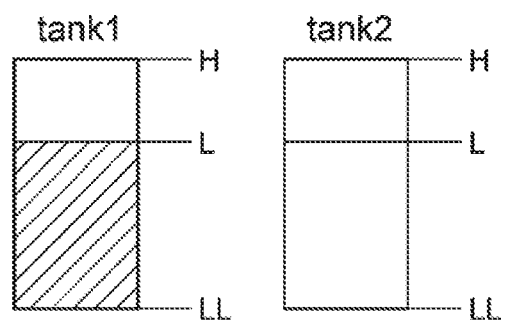
Figure 10D:
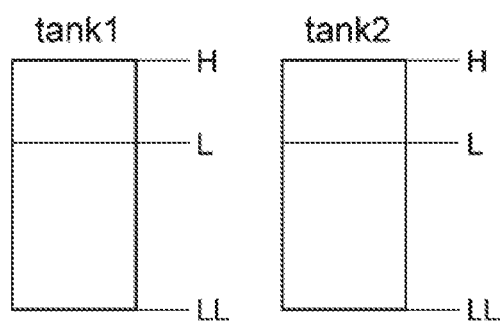
Figure 11:
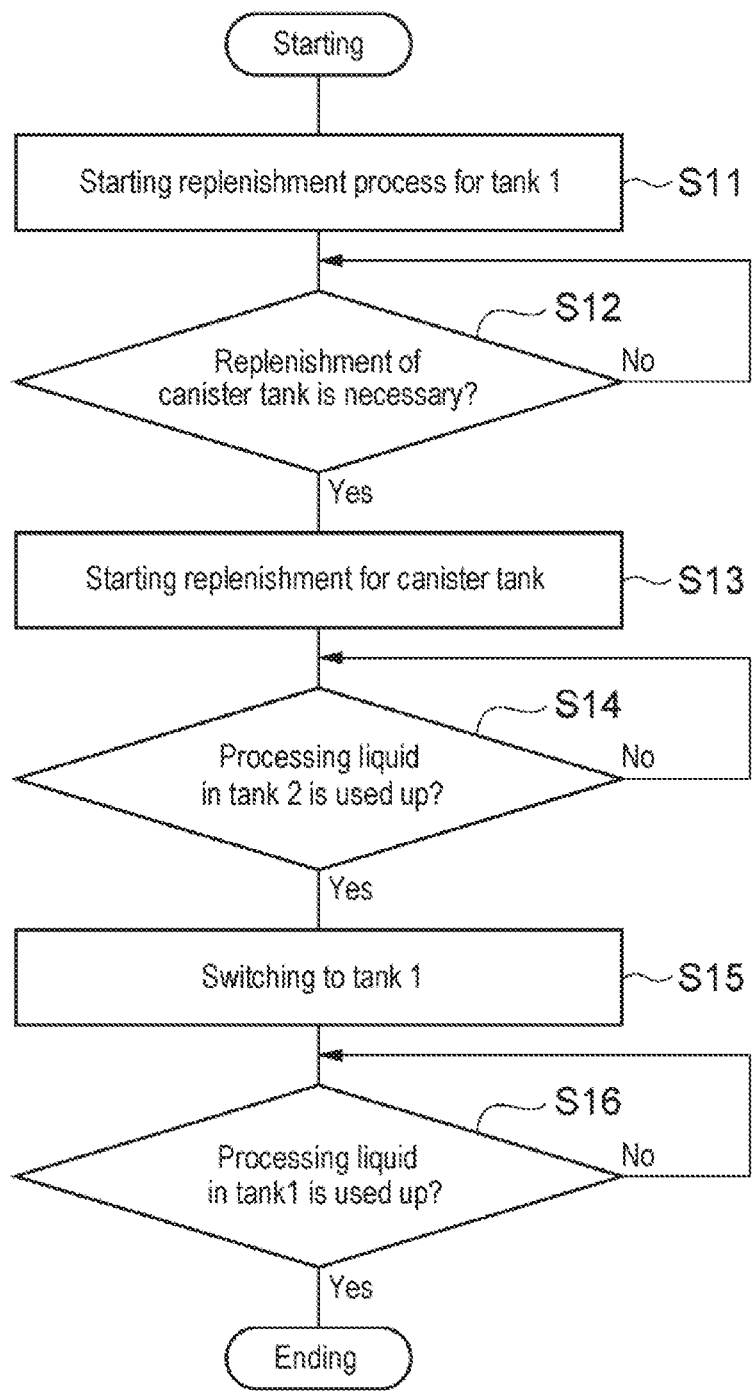
FIG. 11 is a flowchart illustrating an example of a procedure for using a processing liquid in the tank.

FIG. 10A schematically illustrates a state where the processing liquid is filled up to the first liquid surface height in both the tanks 61A and 61B. When the processing liquid in the tank 61A is used and the liquid surface LS of the processing liquid in the tank 61A is lower than the second liquid surface height (see FIG. 10B), the controller 100 starts the replenishment process for the tank 61A (step S1). When it is determined that the processing liquid in the canister tank 71 needs to be replenished during the replenishment process for the tank 61A (step S12: "YES"), the replenishment for the canister tank 71 starts (step S13). With the start of the replenishment of the processing liquid in the canister tank 71, the controller 100 stops the replenishment process of the processing liquid in the tank 61A. While it is determined that the replenishment of the processing liquid in the canister tank 71 is not necessary (step S12: "NO"), the replenishment process for the tank 61A is continued.

While the replenishment of the processing liquid in the canister tank 71 is performed, the controller 100 performs a control according to the processing of the following steps S14 to S16. At step S14, the controller 100 controls the liquid supply 30 so as to use up the processing liquid in the tank 61B. For example, the controller 100 continues to supply the processing liquid from the tank 61B to the nozzle 22 until the liquid surface LS of the processing liquid in the tank 61B is lower than the third liquid surface height.

After the processing liquid in the tank 61B is used up (see FIG. 10C), the controller 100 switches the supply source of the processing liquid used for the substrate processing from the tank 61B to the tank 61A (step S15). At this time, the liquid surface LS of the processing liquid in the tank 61A has been already lower than the second liquid surface height. The controller 100 controls the liquid supply 30 so as to use up the processing liquid in the tank 61A (step S16). For example, the controller 100 continues to supply the processing liquid from the tank 61A to the nozzle 22 until the liquid surface LS of the processing liquid in the tank 61A is lower than the third liquid surface height.

After the processing liquids in both the tanks 61A and 61B are used up (see FIG. 10D), for example, the controller 100 temporarily suspends the coating process by the coating unit U1 until the replenishment of the processing liquid into the canister tank 71 is completed. After the processing liquid is replenished into the canister tank 71 and the processing liquid is replenished into at least one of the tanks 61A and 61B, the controller 100 resumes the coating process by the coating unit U1.

According to this method of using the tank, the processing liquid is used up in both the tanks 61A and 61B while the processing liquid is replenished into the canister tank 71. If any one of the tanks 61A and 61B waits until the replenishment into the canister tank 71 is completed in a state where the processing liquid remains therein while the processing liquid is replenished into the canister tank 71, there is a possibility that the gas may be excessively dissolved in the processing liquid in the container part 81 in the tank. On the other hand, in the using method described above, since the tanks 61A and 61B wait until the replenishment is completed in a state where the processing liquids are used up in both the tanks 61A and 61B, the processing liquid in a state where the gas is excessively dissolved after the waiting can be prevented from being supplied toward the nozzle 22.

Exemplary Modifications of the Tank

Figure 12:
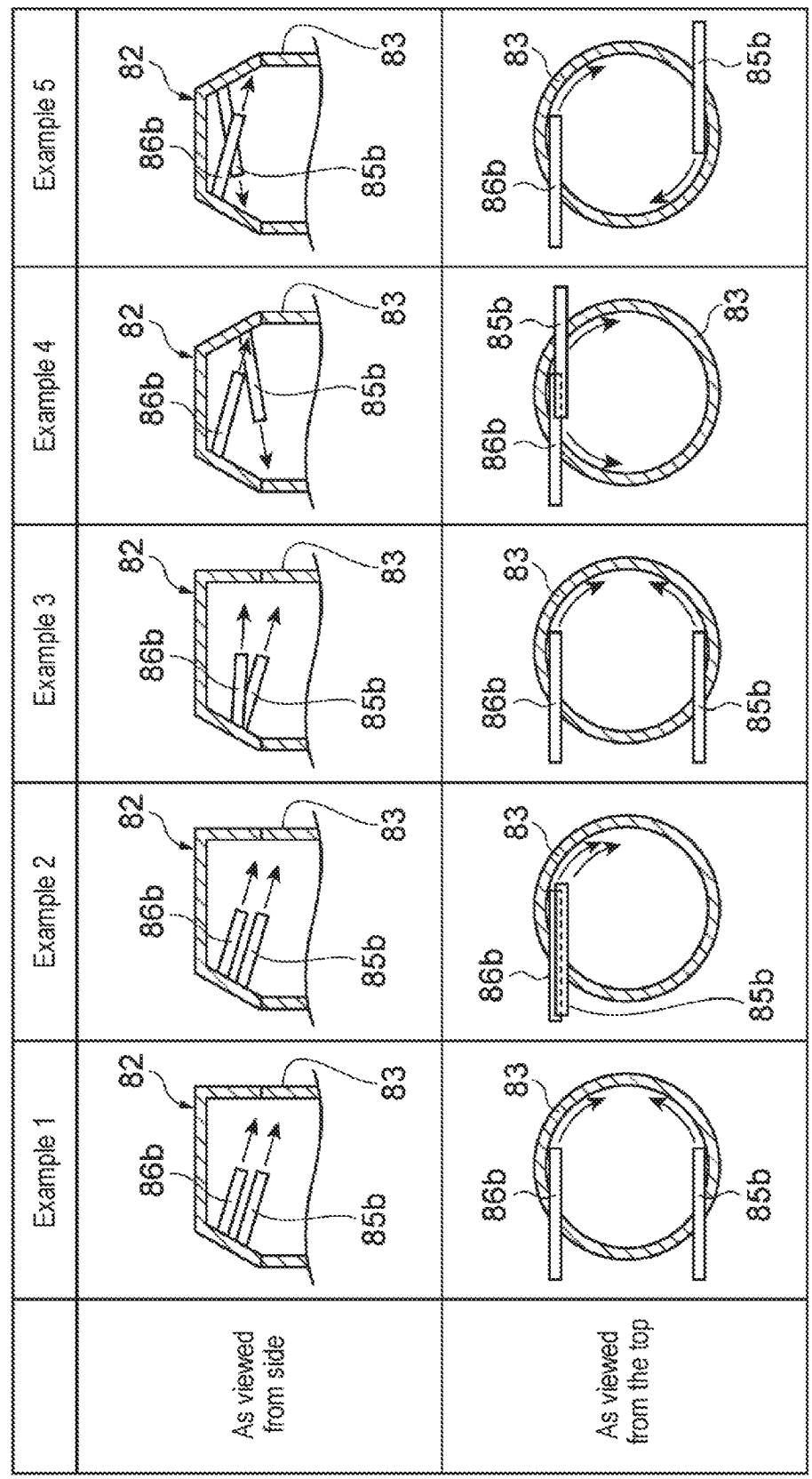
FIG. 12 is a schematic view illustrating a configuration of a tank according to an exemplary modification of the present disclosure.

Exemplary modifications of the liquid discharge passage 85 and the gas discharge passage 86 of the tanks 61A and 61B will be described with reference to FIG. 12. The liquid discharge passage 85 and the gas discharge passage 86 in each of the tanks 61A and 61B may be configured as in another examples 1 to 5 illustrated in FIG. 12. As illustrated in an example 1, the inner discharge passage 86b (the gas discharge port 86c) of the gas discharge passage 86 may be arranged above the inner discharge passage 85b (the liquid discharge port 85c) of the liquid discharge passage 85. In this case, the gas supplied from the gas discharge passage 86 is brought into contact with a higher position on the sidewall 83 than the processing liquid supplied from the liquid discharge passage 85, thereby removing the liquid or bubbles adhered to the sidewall 83. As a result, it is possible to prevent the processing liquid discharged from the liquid discharge passage 85 from being adhered to the inner discharge passage 86*b*.

As illustrated in an example 2, arrangements in the vertical direction may be similar to that of the example 1, and both the inner discharge passage 85*b* and the inner discharge passage 86*b* may be located closer to one side surface of the sidewall 83. In other words, both the liquid discharge port 85*c* and the gas discharge port 86*c* may be located in one of two regions (hereinafter, referred to as "divided regions") divided by a plane (a plane extending in the vertical direction) including the center CP (see FIG. 6B).

As illustrated in an example 3, the extension direction of the end of the liquid discharge passage 85 including the liquid discharge port 85*c* (hereinafter, referred to as a "first extension direction"), and the extension direction of the end of the gas discharge passage 86 including the gas discharge port 86*c* (hereinafter, referred to as a "second extension direction") may be inclined at different angles with respect to the horizontal direction. As an example, an inclination angle of the first extension direction with respect to the horizontal direction may be larger than an inclination angle of the second extension direction with respect to the horizontal direction. In this case, a swirl flow of the processing liquid discharged from the liquid discharge port 85*c* along the inner surface of the sidewall 83 can be preferentially formed. Furthermore, the second extension direction may be along the horizontal direction.

As illustrated in examples 4 and 5, the discharge direction (orientation) of the processing liquid discharged from the liquid discharge passage 85 and the discharge direction (orientation) of the gas discharged from the gas discharge passage 86 may be opposite to each other. In this case, as in the example 4, both the inner discharge passage 85*b* and the inner discharge passage 86*b* may be arranged in one of the divided regions. Alternatively, as in the example 5, the inner discharge passage 85*b* and the inner discharge passage 86*b* may be respectively arranged in the two divided regions. In the configuration illustrated in the example 5, similar to the configuration illustrated in the example 1 described above, the processing liquid discharged from the liquid discharge passage 85 can be prevented from being adhered to the inner discharge passage 86*b*.

Other Exemplary Modifications

Various modifications are possible to the respective parts other than the aforementioned parts. For example, the discharge direction (orientation) of the gas discharged from the gas discharge ports 86*c* is not limited to the horizontal direction or the downward oblique orientation. The discharge direction (orientation) of the gas may be upward or may be an upward oblique orientation. For example, the inner discharge passage 86*b* may extend so that it is located upward as it goes toward the gas discharge port 86*c*. Furthermore, as described above, the arrangements of the liquid discharge passage 85 and the gas discharge passage 86 may be appropriately changed within a range in which the processing liquid discharged from the liquid discharge port 85*c* and the gas discharged from the gas discharge port 86*c* can be brought into contact with a portion above the liquid surface LS of the inner surface of the sidewall 83 of the container part 81.

Figure 13A:
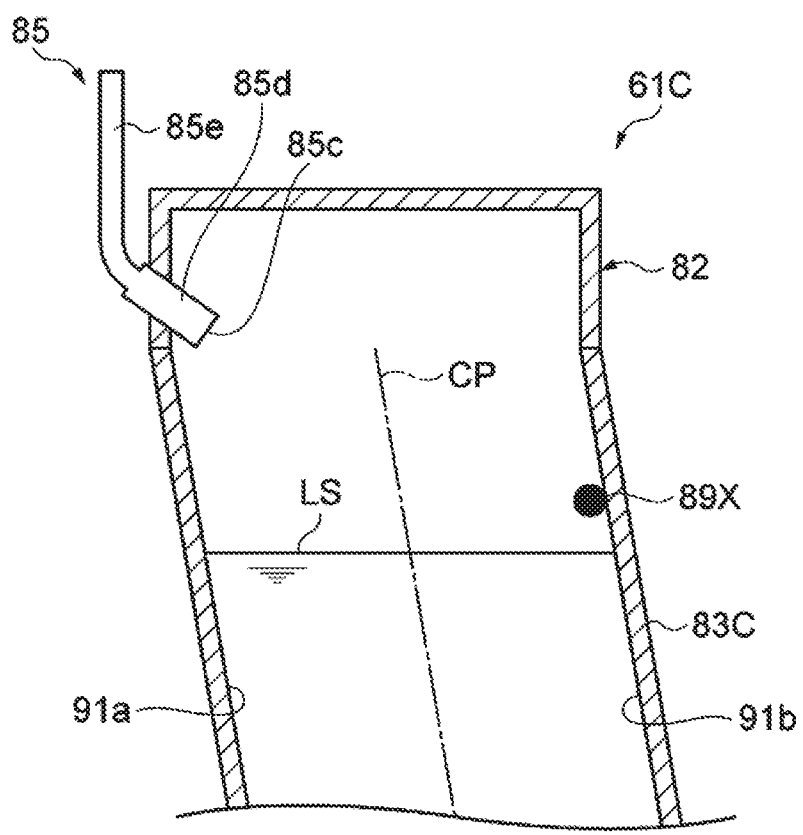
FIG. 13A is a schematic view illustrating a cross-sectional configuration of the tank as viewed from the side.
Figure 13B:
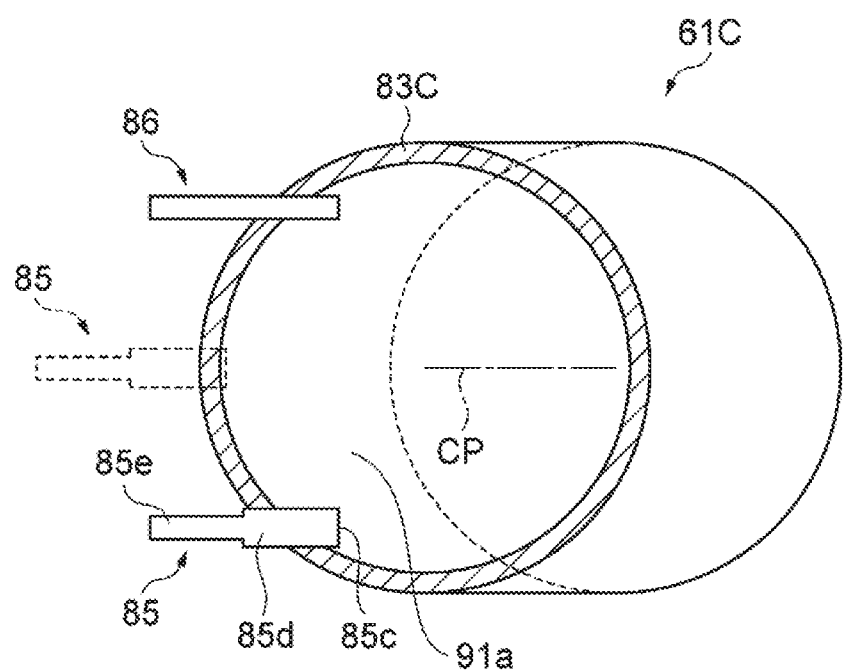
FIG. 13B is a schematic view illustrating a cross-sectional configuration of the tank as viewed from the top.

A tank 61C according to an exemplary modification will be described with reference to FIGS. 13A and 13B. FIG. 13A schematically illustrates a cross-sectional configuration of the tank 61C as viewed from the side, and FIG. 13B schematically illustrates a cross-sectional configuration of the tank 61C as viewed from the top. The tank 61C differs from the tanks 61A and 61B in that the tank 61C has a sidewall 83C instead of the sidewall 83 and that the liquid discharge passage 85 has a discharge part 85*d* and a delivery part 85*e*.

At least a portion of the sidewall 83C is inclined to the vertical direction. The entire sidewall 83C may be inclined to the vertical direction, and a portion of the sidewall 83C located below the liquid discharge port 85*c* may be inclined to the vertical direction. The sidewall 83C may have an inner surface inclined to the vertical direction so that the processing liquid discharged from the liquid discharge port 85*c* flows along the inner surface of the sidewall 83 toward the liquid surface LS. In the example illustrated in FIGS. 13A and 13B, the inner surface of the sidewall 83C is inclined to the vertical direction so that the center CP of the container part 81 including the sidewall 83C becomes more separated from the liquid discharge port 85*c* as it goes downward. Furthermore, the position (direction) which moves as the center CP goes downward is not limited to this example, but may be changed according to a position with which the processing liquid discharged from the liquid discharge port 85*c* is brought into contact.

The sidewall 83C has an inclined surface 91*a* and an inclined surface 91*b*. The inclined surface 91*a* is a portion exposed upward (visible as viewed in a plan view) when the upper wall 82 is removed from the inner surface of the sidewall 83C. As illustrated in FIG. 13A, the angle of the inclined surface 91*a* with respect to the horizontal plane is smaller than 90°. The inclined surface 91*b* is a portion not exposed upward (not visible as viewed in a plan view) even if the upper wall 82 is removed from the inner surface of the sidewall 83C. As illustrated in FIG. 13A, the angle of the inclined surface 91*b* with respect to the horizontal plane is larger than 90°. For example, the processing liquid discharged from the liquid discharge port 85*c* is brought into contact with the inclined surface 91*a* to flow while rotating along the inner surface of the sidewall 83C including the inclined surfaces 91*a* and 91*b*. Alternatively, the processing liquid discharged from the liquid discharge port 85*c* is brought into contact with the inclined surface 91*a* to flow obliquely downward along the inclined surface 91*a*. Furthermore, in a case where the processing liquid is allowed to flow obliquely downward along the inclined surface 91*a*, the liquid discharge port 85*c* may be arranged at a position corresponding to a portion of the inclined surface 91*a* having the gentlest inclination angle (a small angle with respect to the horizontal plane) (see the liquid discharge passage 85 indicated by a broken line in FIG. 13B).

In the tank 61C, the flow velocity of the processing liquid discharged from the liquid discharge port 85*c* and flowing along the sidewall 83C can be slower, compared with the case where the processing liquid flows along the sidewall 83 extending in the vertical direction. Therefore, when the processing liquid flowing along the inner surface of the sidewall 83C reaches the liquid surface LS, the vertical downward component of the flow velocity of the processing liquid is reduced. As a result, it is possible to suppress the foaming of the processing liquid caused by contact of the processing liquid with the liquid surface LS through the inner surface of the sidewall 83C.

In the example illustrated in FIGS. 13A and 13B, the cross-sectional area of the region surrounded by the inner surface of the sidewall 83C in the horizontal plane is substantially constant at each height position. With this configuration, it is easy to manage the amount of the processing liquid in the tank 61C and to control the pressure applied to the liquid surface LS by the gas. Alternatively, the sidewall 83C may have the inclined surface 91a, and a portion of the sidewall 83C corresponding to the inclined surface 91b may not be inclined to the vertical direction. In this case, the cross-sectional area of the region surrounded by the inner surface of the sidewall 83C in the horizontal plane is reduced as it goes downward. With this configuration, since the area of the processing liquid (liquid surface LS) making contact with the gas is reduced as the liquid surface LS is lowered, the gas can be suppressed from being dissolved.

The discharge part 85d is a portion of the liquid discharge passage 85 including the liquid discharge port 85c, and the delivery part 85e is a portion of the liquid discharge passage 85, which delivers the processing liquid to the discharge part 85d. The cross-sectional area (flow passage cross-sectional area) of the discharge part 85d orthogonal to the direction in which the processing liquid flows is larger than the cross-sectional area (flow passage cross-sectional area) of the delivery part 85e orthogonal to the direction in which the processing liquid flows. For example, the diameter of the discharge part 85d (more specifically, the diameter of the flow passage formed by the discharge part 85d) is larger than the diameter of the delivery part 85e (more specifically, the diameter of the flow passage formed by the delivery part 85e). The diameter of the discharge portion 85d may be substantially constant, or may be gradually increased toward the liquid discharge port 85c.

With this configuration, the difference between the pressure applied to the processing liquid immediately before it is discharged into the tank and the pressure applied to the processing liquid immediately after it is discharged becomes small. Therefore, immediately after the processing liquid is discharged into the tank, it is possible to suppress disturbance in the behavior of the liquid (disruption of the discharge state) caused by release of the pressure applied to the processing liquid. In addition, the discharge part 85d may be inclined downward toward the liquid discharge port 85c. In this case, the retention of the processing liquid in the liquid discharge passage 85 (discharge part 85d) is prevented.

Furthermore, a configuration of a tank in which the liquid discharge port is formed below the uppermost position of the liquid surface LS may also be considered. For example, in this tank, the liquid discharge port may be arranged at a position corresponding to a position between the liquid surface sensor 89X and the liquid surface sensor 89Y in the tank 61A or the like. There is a possibility that, when the liquid surface LS is below the liquid discharge port, droplets are generated by discharge of the processing liquid to be adhered to the inner surface of the sidewall 83, but in the tank of the aforementioned configuration, the droplets may be recovered when the liquid surface LS becomes higher than the liquid discharge port. Furthermore, regarding the tanks 61A to 61C, it is possible to configure such that the liquid discharge port 85c is located above the liquid surface LS when the tank is used, and the processing liquid (rinsing solution) may be replenished into the tank until the liquid surface is located above the liquid discharge port 85c, during maintenance of the tank.

As a method of pressurizing a nitrogen gas into the tanks 61A and 61B, the interior of the tanks 61A and 61B may be pressurized by using a diaphragm in combination with the supply of the gas into the container part 81 as in the aforementioned embodiment or instead of the supply of the gas. The interior of the diaphragm may be filled with the nitrogen gas.

The substrate to be processed is not limited to the semiconductor wafer, but may be, for example, a glass substrate, a mask substrate, a flat panel display (FPD), or the like.

The configuration of each part of the liquid supply 30 described in the aforementioned embodiment may be appropriately modified. For example, there has been described a configuration in which the two liquid feeding parts 60A and 60B are installed in the pressure delivery part 32 for delivering the liquid toward the plurality of nozzles 22, and the tanks 61A and 61B are installed in each of them, but the number of the liquid feeding parts 60A and 60B may be one or three or more. Furthermore, the tanks 61A and 61B may have different structures. In addition, only one of the tanks 61A and 61B may have the configuration described above.

According to the present disclosure in some embodiments, it is possible to provide a tank, a substrate processing apparatus, and a method of using the tank, which are capable of preventing a processing liquid containing bubbles from being supplied to a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A tank, comprising:
   a container part having an upper wall extending in a horizontal direction, a sidewall extending along a vertical direction and a bottom wall, and configured to store a processing liquid therein;
   a liquid discharge passage having a liquid discharge port installed at a position higher than a liquid surface of the processing liquid stored in the container part, and configured to discharge the processing liquid into the container part; and
   a gas discharge passage having a gas discharge port installed at a position higher than the liquid surface, and configured to discharge a gas into the container part,
   wherein the liquid discharge passage is configured to discharge the processing liquid from the liquid discharge port so that the processing liquid is brought into contact with a portion above the liquid surface of an inner surface of the sidewall,
   wherein the gas discharge passage is configured to discharge the gas from the gas discharge port so that the gas is brought into contact with a portion above the liquid surface of an inner surface of the container part,
   wherein a cross section of the inner surface of the sidewall is circular in a plane intersecting the vertical direction, and
   wherein both a virtual line extending in an extension direction of an end of the liquid discharge passage including the liquid discharge port, and a virtual line extending in an extension direction of an end of the gas discharge passage including the gas discharge port are not orthogonal to the inner surface of the sidewall, as viewed in a plan view.

2. The tank of claim 1, wherein the processing liquid is a liquid supplied to a surface of a substrate in order to process the substrate.

3. The tank of claim 1, wherein an extension direction of an end of the liquid discharge passage including the liquid discharge port is inclined to the vertical direction.

4. The tank of claim 1, wherein the liquid discharge port and the gas discharge port are opposite to each other with a center in the container part interposed therebetween, as viewed in a plan view.

5. The tank of claim 1, further comprising a plurality of liquid surface detection parts, each configured to detect that a height of the liquid surface reaches a predetermined position, and
wherein the predetermined position detected by each of the plurality of liquid surface detection parts is lower than the liquid discharge port, the gas discharge port, a position at which the processing liquid discharged from the liquid discharge port is brought into contact with the sidewall, and a position at which the gas discharged from the gas discharge port is brought into contact with the container part.

6. The tank of claim 1, wherein at least a portion of the inner surface of the sidewall located below the liquid discharge port is inclined to the vertical direction so that the processing liquid flows along the inner surface of the sidewall.

7. The tank of claim 1, wherein the liquid discharge passage has a discharge part including the liquid discharge port, and a delivery part configured to deliver the processing liquid to the discharge part, and
a flow passage cross-sectional area of the discharge part is larger than a flow passage cross-sectional area of the delivery part.

8. A substrate processing apparatus, comprising:
a liquid supply having a tank configured to temporarily store a processing liquid used for substrate processing; and
a nozzle configured to discharge the processing liquid supplied from the liquid supply toward a substrate to be processed,
wherein the tank comprises:
a container part having an upper wall extending in a horizontal direction, a sidewall extending along a vertical direction and a bottom wall, and configured to store the processing liquid therein;
a liquid discharge passage having a liquid discharge port installed at a position higher than a liquid surface of the processing liquid stored in the container part, and configured to discharge the processing liquid into the container part; and
a gas discharge passage having a gas discharge port installed at a position higher than the liquid surface, and configured to discharge a gas into the container part,
wherein the liquid discharge passage is configured to discharge the processing liquid from the liquid discharge port so that the processing liquid is brought into contact with a portion above the liquid surface of an inner surface of the sidewall,
wherein the gas discharge passage is configured to discharge the gas from the gas discharge port so that the gas is brought into contact with a portion above the liquid surface of an inner surface of the container part,
wherein a cross section of the inner surface of the sidewall is circular in a plane intersecting the vertical direction, and
wherein both a virtual line extending in an extension direction of an end of the liquid discharge passage including the liquid discharge port, and a virtual line extending in an extension direction of an end of the gas discharge passage including the gas discharge port are not orthogonal to the inner surface of the sidewall, as viewed in a plan view.

9. The apparatus of claim 8, further comprising a controller configured to control the liquid supply,
wherein the liquid supply further includes a gas delivery pipe configured to supply the gas to the tank via the gas discharge passage, and a pressure regulation part installed in the gas delivery pipe and configured to adjust pressure by the gas in the container part, and
the controller is configured to control the pressure regulation part such that an internal pressure of the container part gradually rises when an interior of the container part is pressurized from a state where the pressure is released.

10. A method of using a tank comprising a container part having an upper wall extending in a horizontal direction, a sidewall extending along a vertical direction and a bottom wall, and configured to store a processing liquid therein; a liquid discharge passage having a liquid discharge port installed at a position higher than a liquid surface of the processing liquid stored in the container part, and configured to discharge the processing liquid into the container part; and a gas discharge passage having a gas discharge port installed at a position higher than the liquid surface, and configured to discharge a gas into the container part, the method comprising:
discharging the processing liquid from the liquid discharge port so that the processing liquid is brought into contact with a portion above the liquid surface of an inner surface of the sidewall; and
discharging the gas from the gas discharge port so that the gas is brought into contact with a portion above the liquid surface of an inner surface of the container part,
wherein a cross section of the inner surface of the sidewall is circular in a plane intersecting the vertical direction, and
wherein both a virtual line extending in an extension direction of an end of the liquid discharge passage including the liquid discharge port, and a virtual line extending in an extension direction of an end of the gas discharge passage including the gas discharge port are not orthogonal to the inner surface of the sidewall, as viewed in a plan view.

11. A method of using a tank comprising a container part having an upper wall extending in a horizontal direction, a sidewall extending along a vertical direction and a bottom wall, and configured to store a processing liquid therein; a liquid discharge passage having a liquid discharge port installed at a position higher than a liquid surface of the processing liquid stored in the container part, and configured to discharge the processing liquid into the container part; a gas discharge passage having a gas discharge port installed at a position higher than the liquid surface, and configured to discharge a gas into the container part; and a degassing part configured to degas the container part, the method comprising:
discharging the gas from the gas discharge port so that the gas is brought into contact with a portion above the liquid surface of an inner surface of the sidewall, while degassing the gas in the container part from the degassing part, wherein a cross section of the inner surface of the sidewall is circular in a plane intersecting the vertical direction, and wherein both a virtual line extending in an extension direction of an end of the liquid discharge passage including the liquid discharge port, and a virtual line extending in an extension direction of an end of the gas discharge passage including the gas discharge port are not orthogonal to the inner surface of the sidewall, as viewed in a plan view.

* * * * *